(12) United States Patent
Liaw

(10) Patent No.: US 12,218,137 B2
(45) Date of Patent: Feb. 4, 2025

(54) STRUCTURE AND METHOD FOR GATE-ALL-AROUND METAL-OXIDE-SEMICONDUCTOR DEVICES WITH IMPROVED CHANNEL CONFIGURATIONS

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/447,407

(22) Filed: Aug. 10, 2023

(65) Prior Publication Data

US 2023/0395601 A1 Dec. 7, 2023

Related U.S. Application Data

(60) Continuation of application No. 17/858,989, filed on Jul. 6, 2022, now Pat. No. 11,830,878, which is a
(Continued)

(51) Int. Cl.
*H01L 27/092* (2006.01)
*H01L 21/8238* (2006.01)
(Continued)

(52) U.S. Cl.
CPC .. *H01L 27/0924* (2013.01); *H01L 21/823807* (2013.01); *H01L 21/823814* (2013.01);
(Continued)

(58) Field of Classification Search
CPC ............. H01L 27/0924; H01L 29/0847; H01L 29/1037; H01L 29/66545; H01L 29/66795;
(Continued)

(56) References Cited

U.S. PATENT DOCUMENTS 9,613,953 B2 4/2017 Liaw
9,793,273 B2 10/2017 Liaw
(Continued)

*Primary Examiner* — Christine A Enad
(74) *Attorney, Agent, or Firm* — HAYNES AND BOONE, LLP

(57) ABSTRACT

The present disclosure provides an integrated circuit device that comprises a semiconductor substrate having a top surface; a first and a second source/drain features over the semiconductor substrate; a first semiconductor layer extending in parallel with the top surface and connecting the first and the second source/drain features, the first semiconductor layer having a center portion and two end portions, each of the two end portions connecting the center portion and one of the first and second source/drain features; a first spacer over the two end portions of the first semiconductor layer; a second spacer vertically between the two end portions of the first semiconductor layer and the top surface; and a gate electrode wrapping around and engaging the center portion of the first semiconductor layer. The center portion has a thickness smaller than the two end portions.

20 Claims, 40 Drawing Sheets

Related U.S. Application Data division of application No. 16/657,606, filed on Oct. 18, 2019, now Pat. No. 11,393,817.

(51) Int. Cl.
  *H01L 29/08* (2006.01)
  *H01L 29/10* (2006.01)
  *H01L 29/66* (2006.01)
  *H01L 29/78* (2006.01)

(52) U.S. Cl.
  CPC .. *H01L 21/823821* (2013.01); *H01L 29/0847* (2013.01); *H01L 29/1037* (2013.01); *H01L 29/66545* (2013.01); *H01L 29/66795* (2013.01); *H01L 29/785* (2013.01)

(58) Field of Classification Search
  CPC .......... H01L 29/785; H01L 21/823807; H01L 21/823814; H01L 21/823821
  See application file for complete search history.

(56) References Cited

U.S. PATENT DOCUMENTS

| | | |
|---|---|---|
| 9,805,985 B2 | 10/2017 | Liaw |
| 10,049,940 B1 | 8/2018 | Chen |
| 10,903,317 B1 | 1/2021 | Frougier |
| 2018/0175214 A1 | 6/2018 | Chen |
| 2018/0233586 A1 | 8/2018 | Ching |
| 2019/0326284 A1* | 10/2019 | Kim .................. H01L 21/82345 |
| 2020/0105929 A1* | 4/2020 | Zhang ................. H01L 29/1033 |
| 2020/0168607 A1* | 5/2020 | Yang .................. H01L 29/0696 |
| 2020/0235098 A1* | 7/2020 | Li ........................ H01L 27/092 |

\* cited by examiner

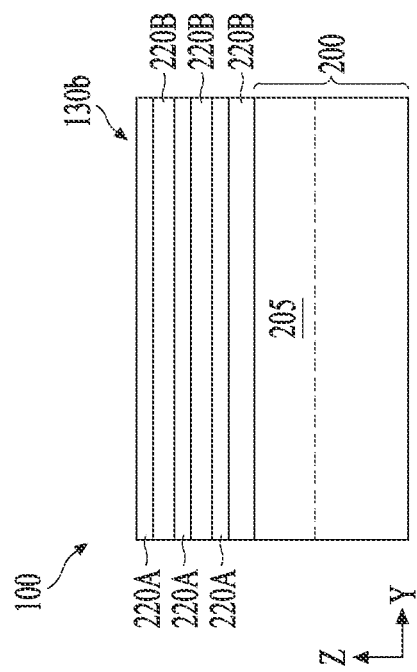
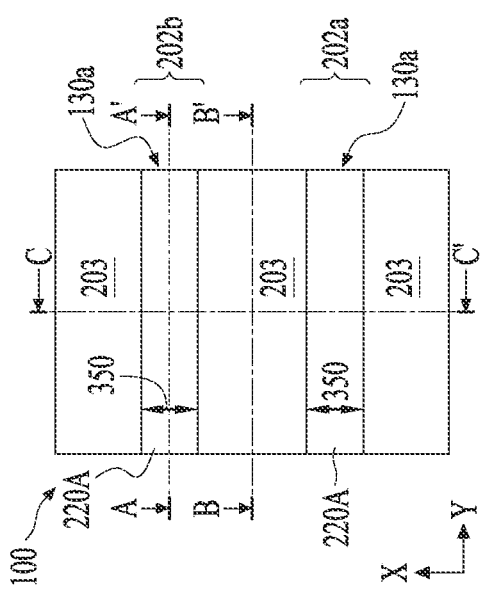
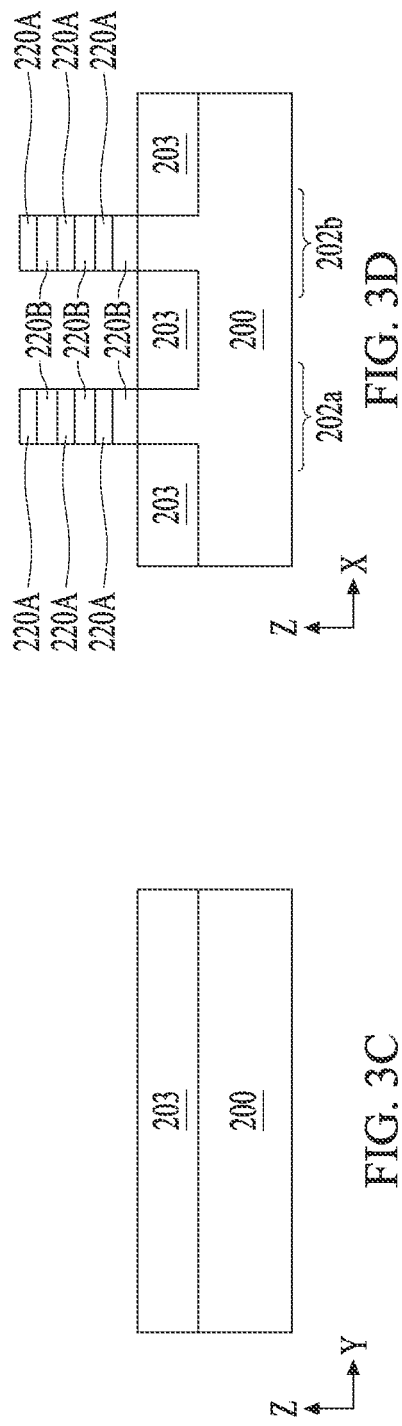

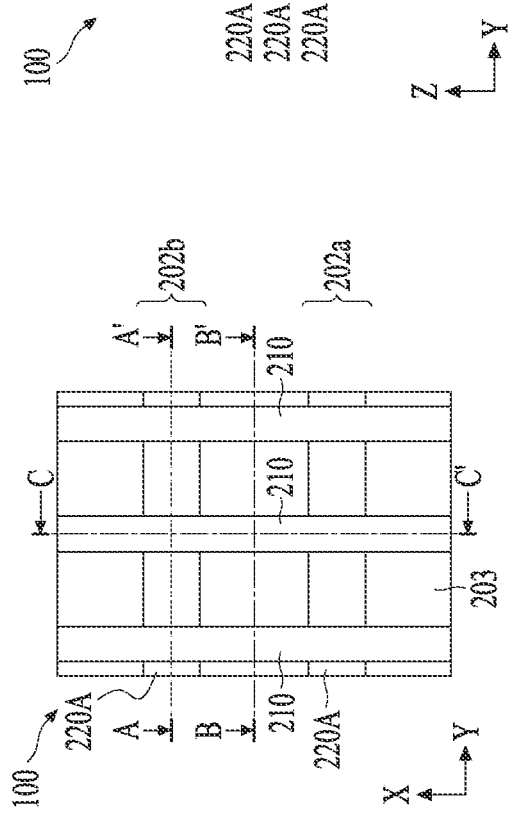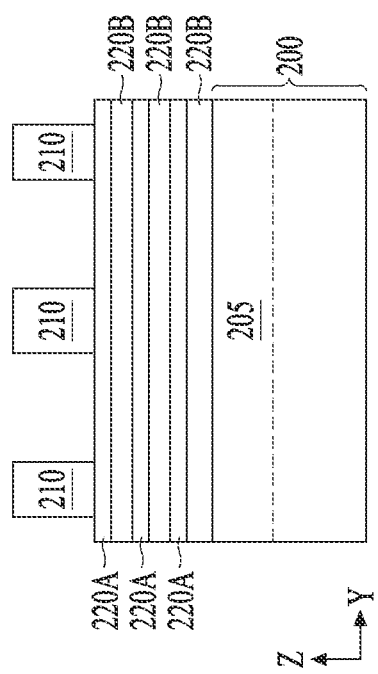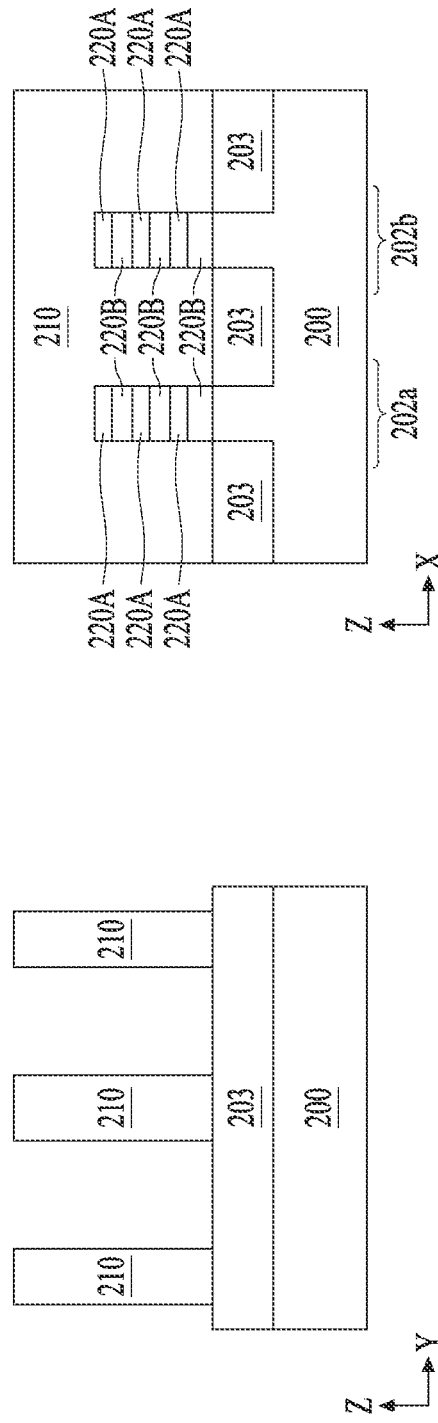
FIG. 4A
FIG. 4B
FIG. 4C
FIG. 4D

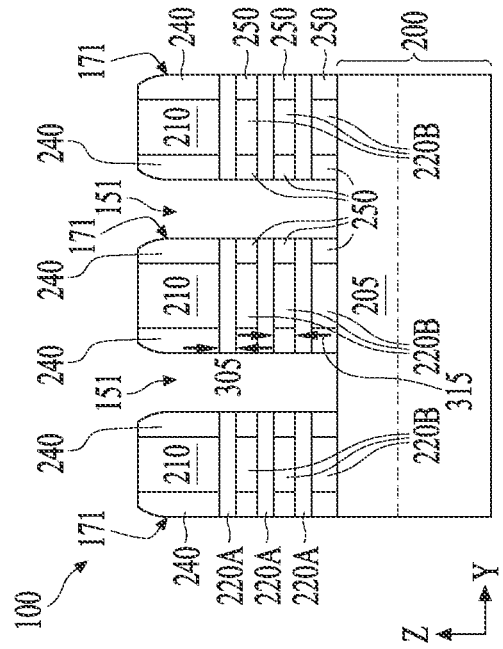
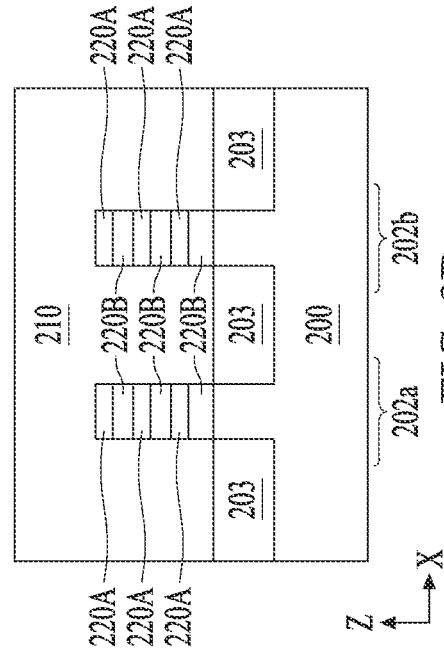
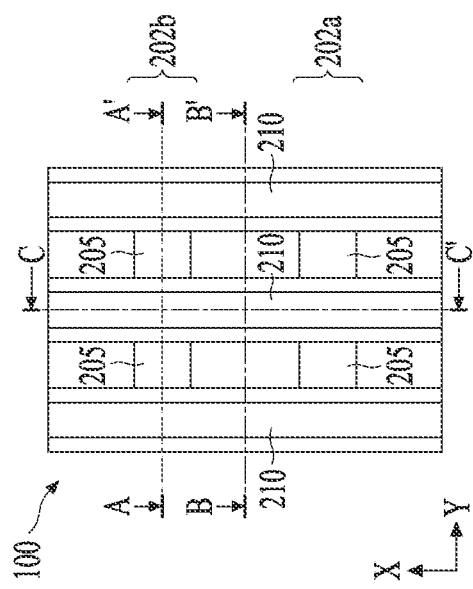
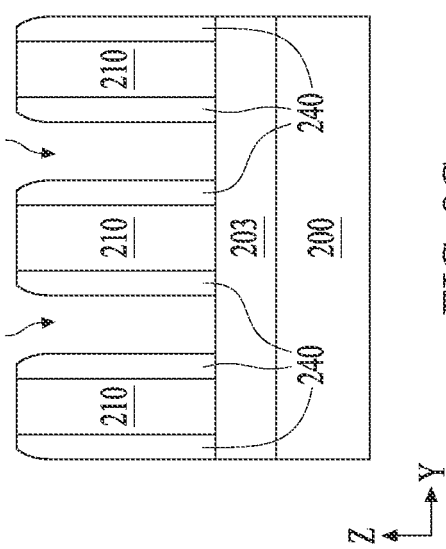
FIG. 9A
FIG. 9B
FIG. 9C
FIG. 9D

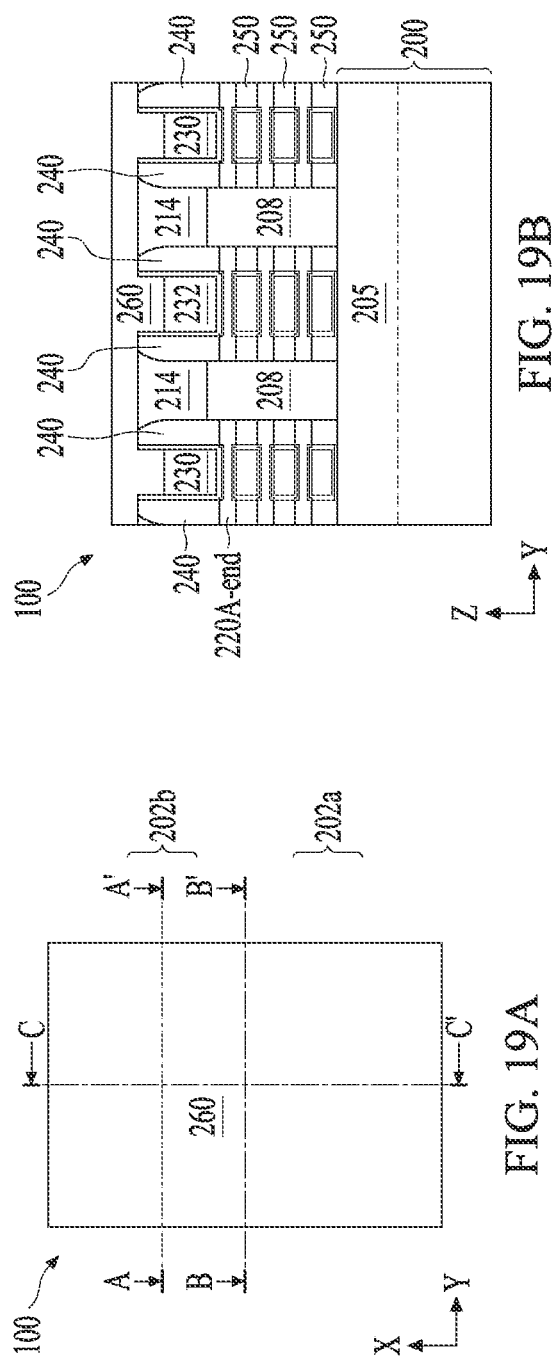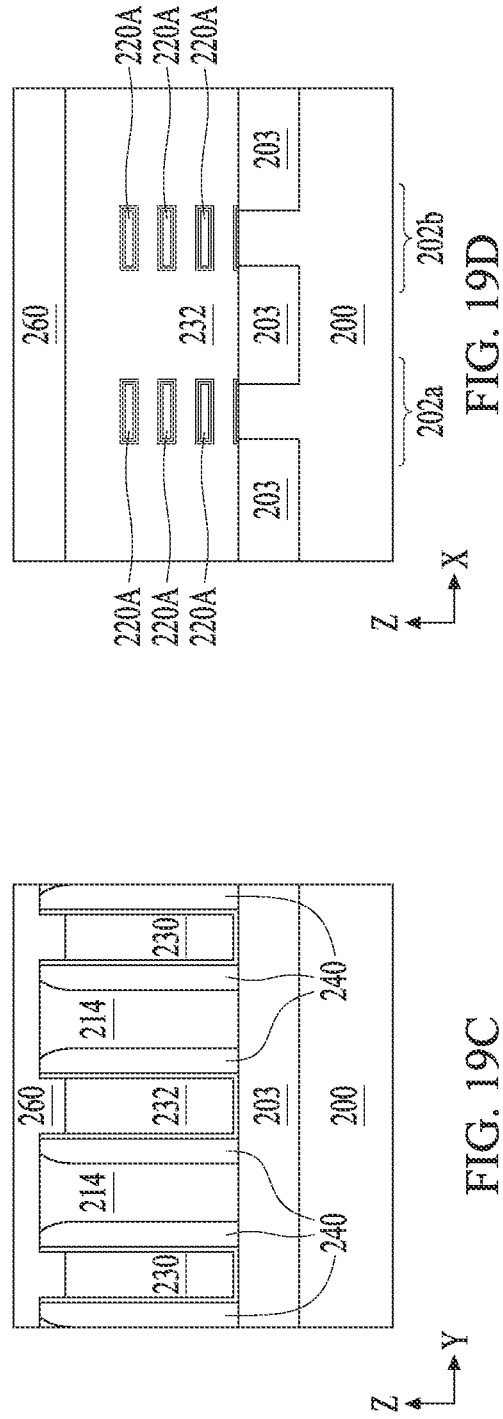

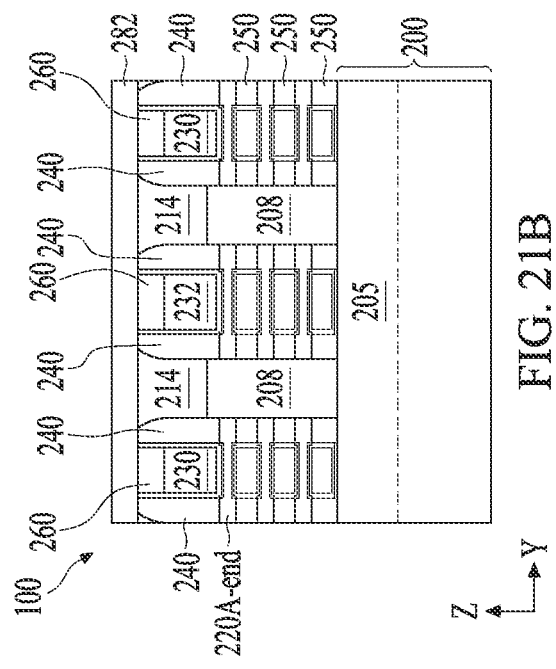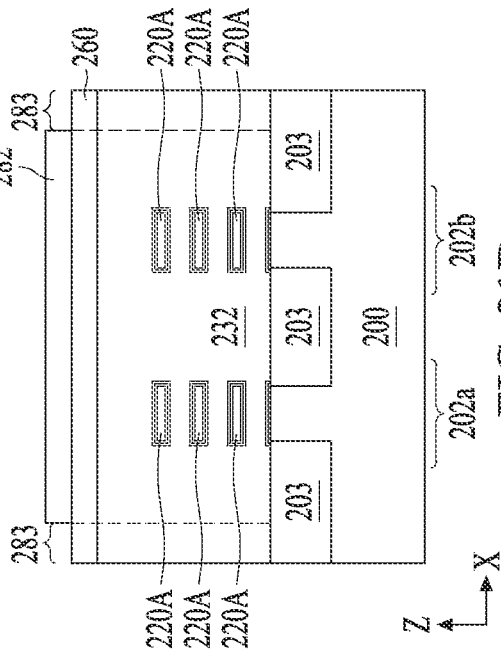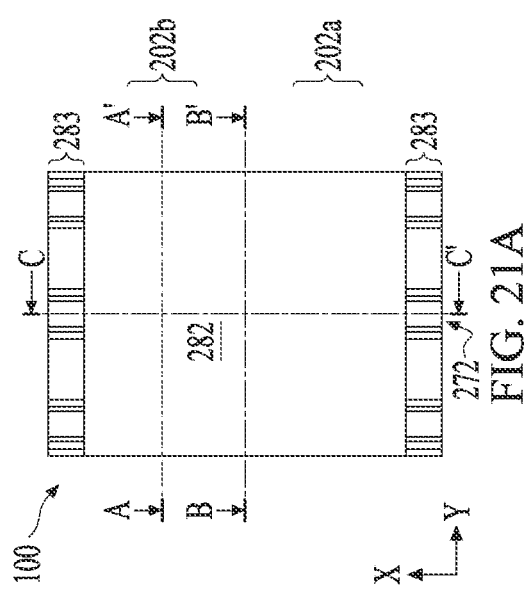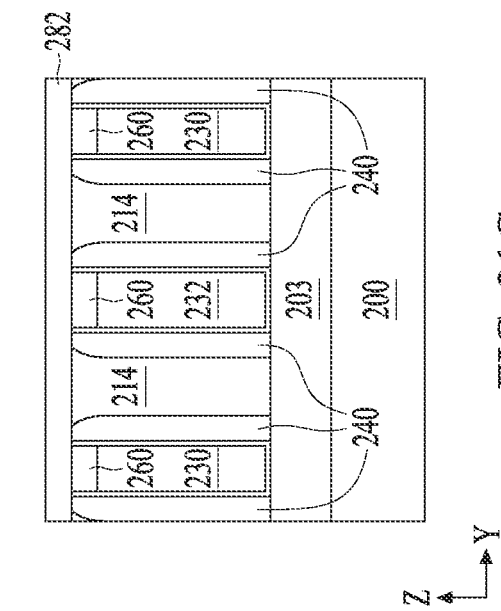

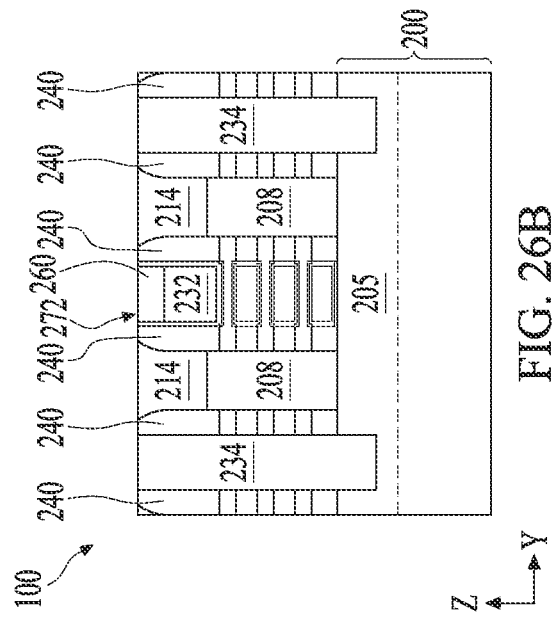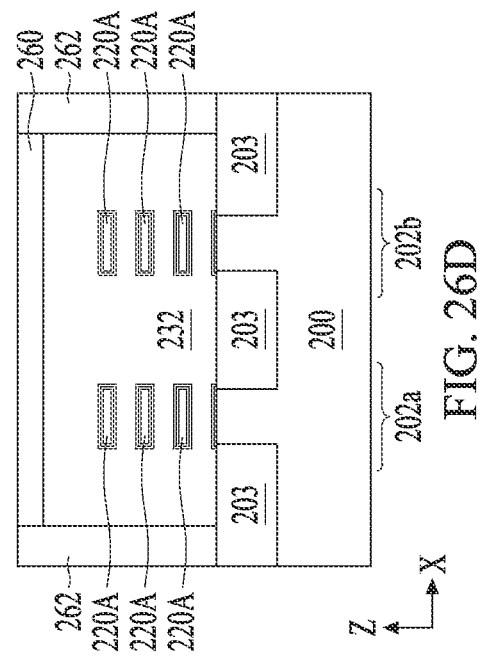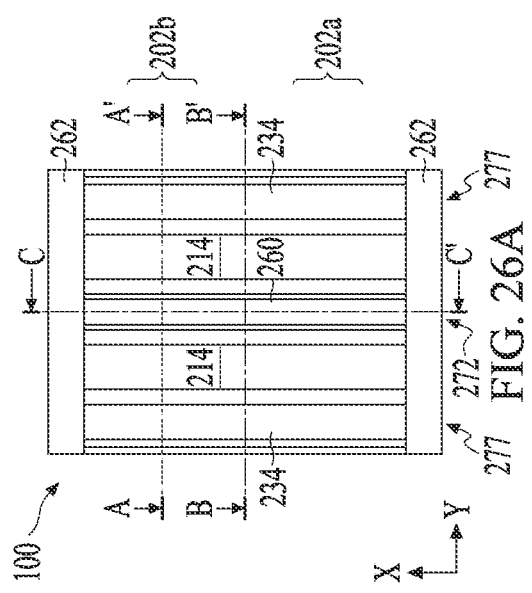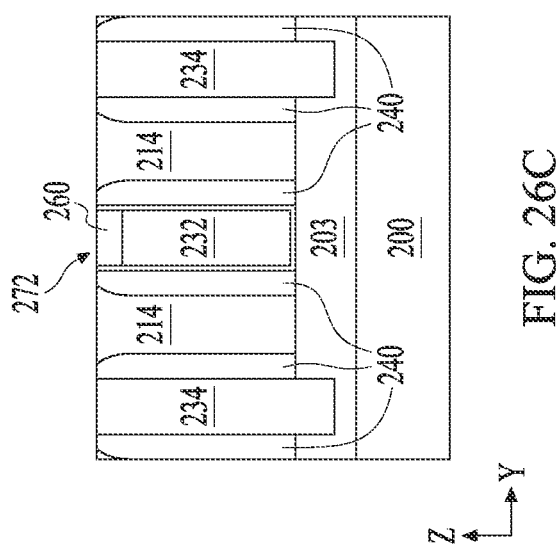

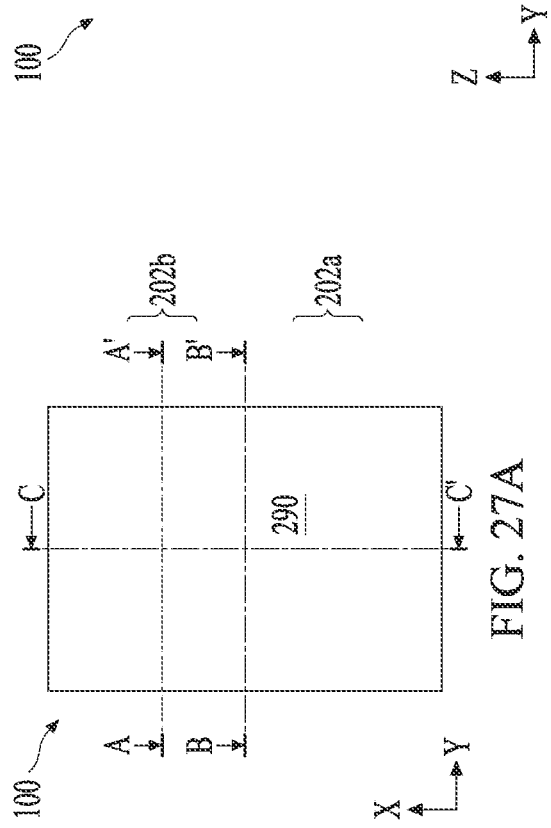
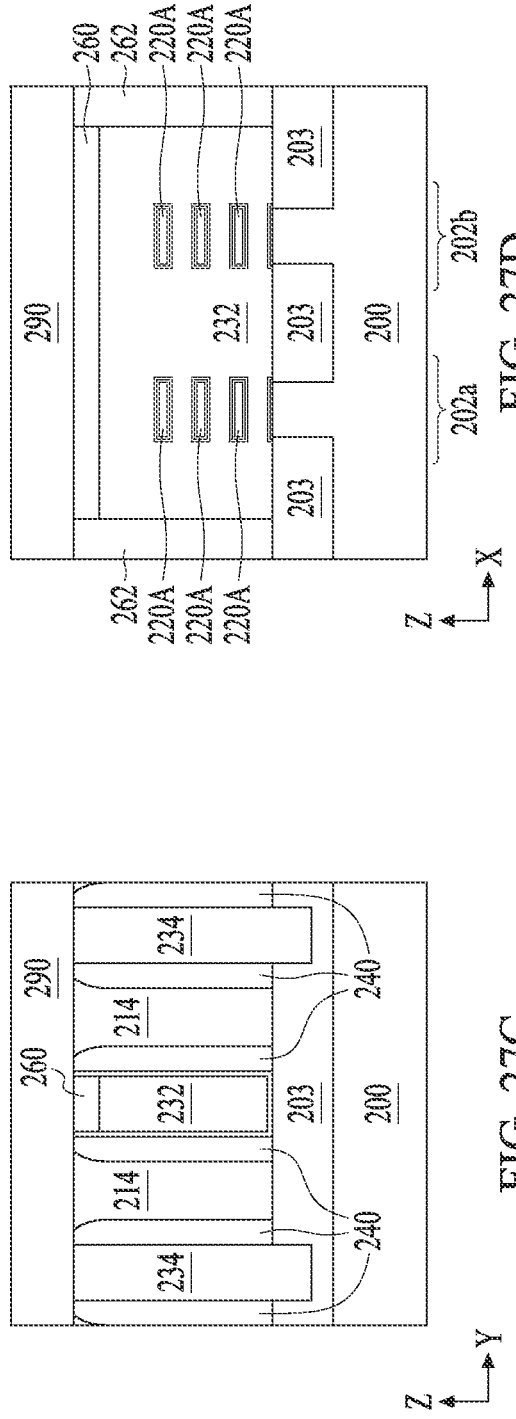
FIG. 27A
FIG. 27B
FIG. 27C
FIG. 27D

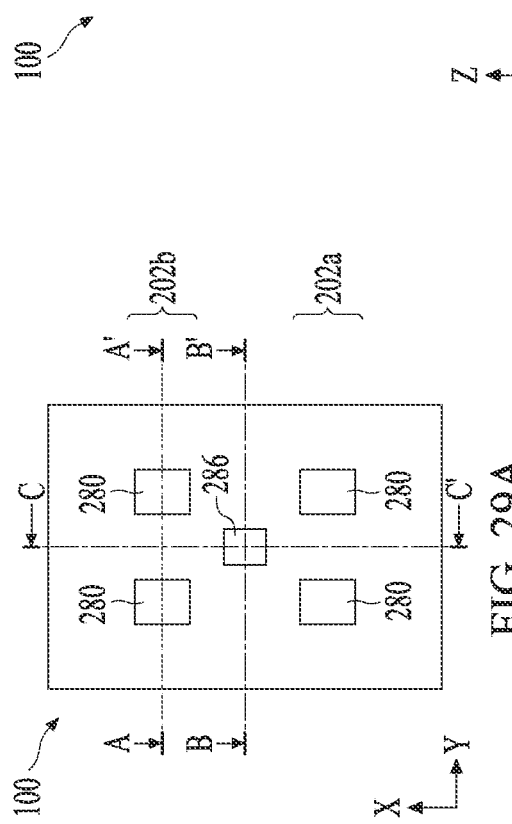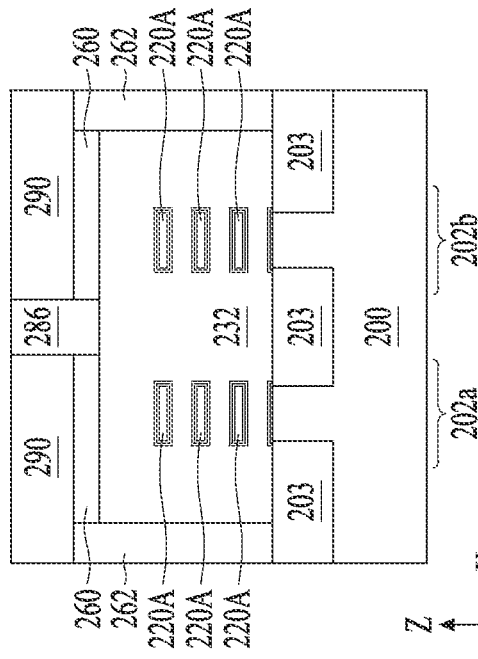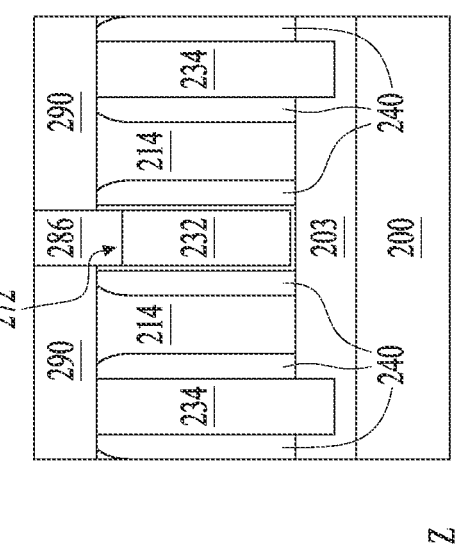
FIG. 29A
FIG. 29B
FIG. 29C
FIG. 29D

STRUCTURE AND METHOD FOR GATE-ALL-AROUND METAL-OXIDE-SEMICONDUCTOR DEVICES WITH IMPROVED CHANNEL CONFIGURATIONS

PRIORITY DATA

This application is a continuation application of U.S. patent application Ser. No. 17/858,989, filed Jul. 6, 2022, which is a divisional application of U.S. patent application Ser. No. 16/657,606, filed Oct. 18, 2019, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is gate-all-around (GAA) transistor, whose gate structure extends around its channel region providing access to the channel region on all sides. The GAA transistors are compatible with conventional complementary metal-oxide-semiconductor (CMOS) processes, allowing them to be aggressively scaled down while maintaining gate control and mitigating SCEs. However, conventional methods for GAA devices may experience challenges including poor epitaxial growth in the source/drain region and small formation margin for gate dielectric and electrode in the narrow channel-channel spaces.

Therefore, although conventional GAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, and 38A are top views of embodiments of GAA devices of the present disclosure constructed at various fabrication stages according to some embodiments of the present disclosure.

FIGS. 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, 31B, 32B, 33B, 34B, 35B, 36B, 37B, and 38B are cross sectional views of embodiments of GAA devices of the present disclosure along the line A-A' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, and 38A, respectively, according to some embodiments of the present disclosure.

FIGS. 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, 29C, 30C, 31C, 32C, 33C, 34C, 35C, 36C, 37C, and 38C are cross sectional views of an embodiment of a GAA device of the present disclosure along the line B-B' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, and 38A, respectively, according to some embodiments of the present disclosure.

FIGS. 2D, 3D, 4D, 5D, 6D, 7D, 8D, 9D, 10D, 11D, 12D, 13D, 14D, 15D, 16D, 17D, 18D, 19D, 20D, 21D, 22D, 23D, 24D, 25D, 26D, 27D, 28D, 29D, 30D, 31D, 32D, 33D, 34D, 35D, 36D, 37D, and 38D are cross sectional views of an embodiment of a GAA device of the present disclosure along the line C-C' in FIGS. 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, and 38A, respectively, according to some embodiments of the present disclosure.

DETAILED DESCRIPTION

Figure 1A:
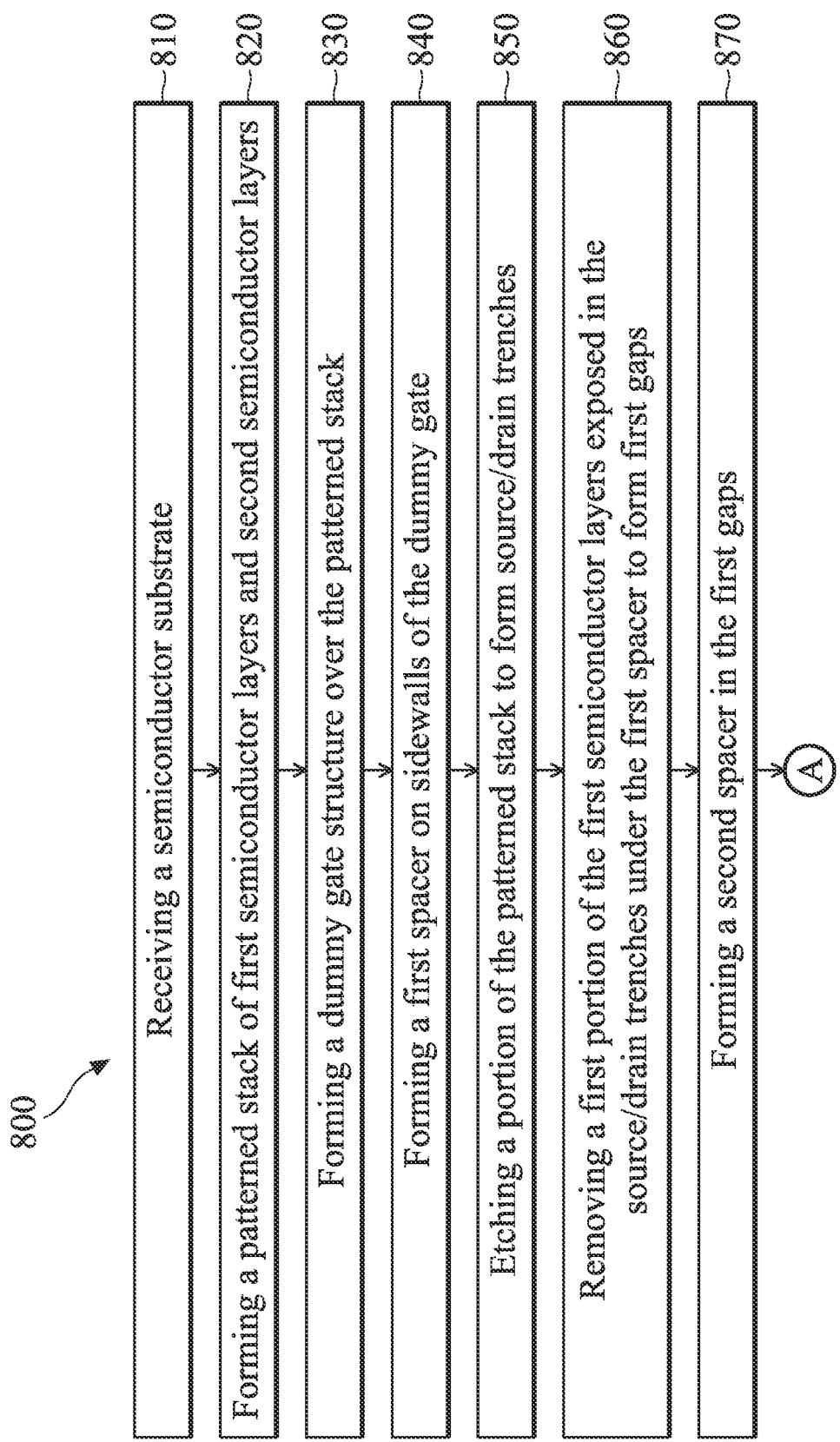
FIGS. 1A, 1B, and 1C are flow charts of an example method for fabricating an embodiment of a GAA device of the present disclosure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" may encompass the dimension range from 4.5 nm to 5.5 nm.

The present disclosure is generally related to ICs and semiconductor devices and methods of forming the same. More particularly, the present disclosure is related to gate-all-around (GAA) devices. A GAA device includes any device that has its gate structure, or portions thereof, formed around all-sides of a channel region (e.g. surrounding a portion of a channel region). In some instances, a GAA device may also be referred to as a quad-gate device where the channel region has four sides and the gate structure is formed on all four sides. The channel region of a GAA device may include one or more semiconductor layers, each of which may be in one of many different shapes, such as wire (or nanowire), sheet (or nanosheet), bar (or nano-bar), and/or other suitable shapes. In embodiments, the channel region of a GAA device may have multiple horizontal semiconductor layers (such as nanowires, nanosheets, or nano-bars) (hereinafter collectively referred to as "nano-channels") vertically spaced, making the GAA device a stacked horizontal GAA device. The GAA devices presented herein may be a complementary metal-oxide-semiconductor (CMOS) GAA device, a p-type metal-oxide-semiconductor (pMOS) GAA device, or an n-type metal-oxide-semiconductor (nMOS) GAA device. Further, the GAA devices may have one or more channel regions associated with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs may benefit from the present disclosure.

In the illustrated embodiments, the IC device includes a GAA device 100. The GAA device 100 may be fabricated during processing of the IC, or a portion thereof, that may comprise static random access memory (SRAM) and/or logic circuits, passive components such as resistors, capacitors, and inductors, and active components such as p-type field effect transistors (pFETs), n-type FETs (nFETs), Fin-FETs, MOSFETs, CMOS, bipolar transistors, high voltage transistors, high frequency transistors, other memory cells, and combinations thereof.

Figure 1B:
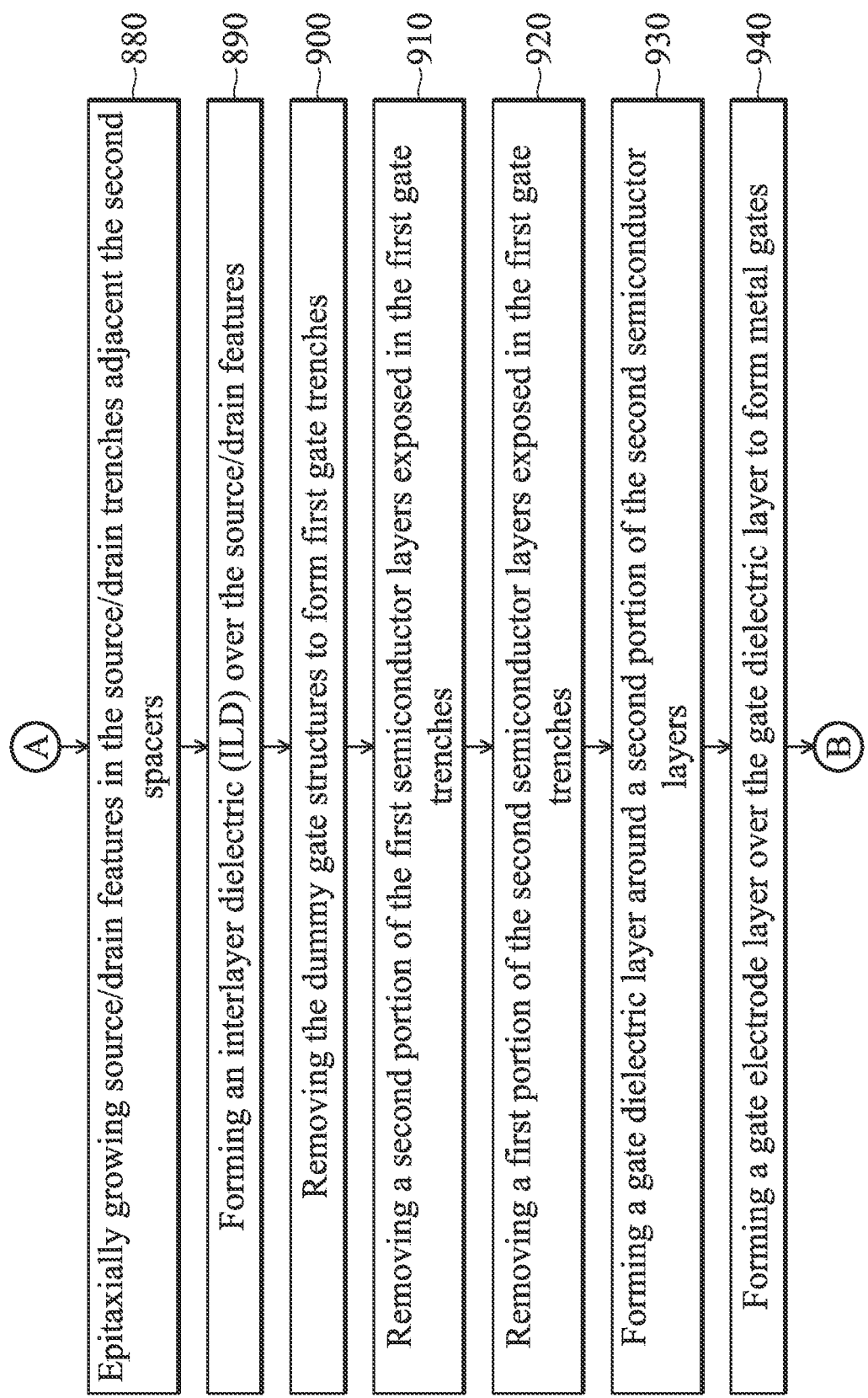
Figure 1C:
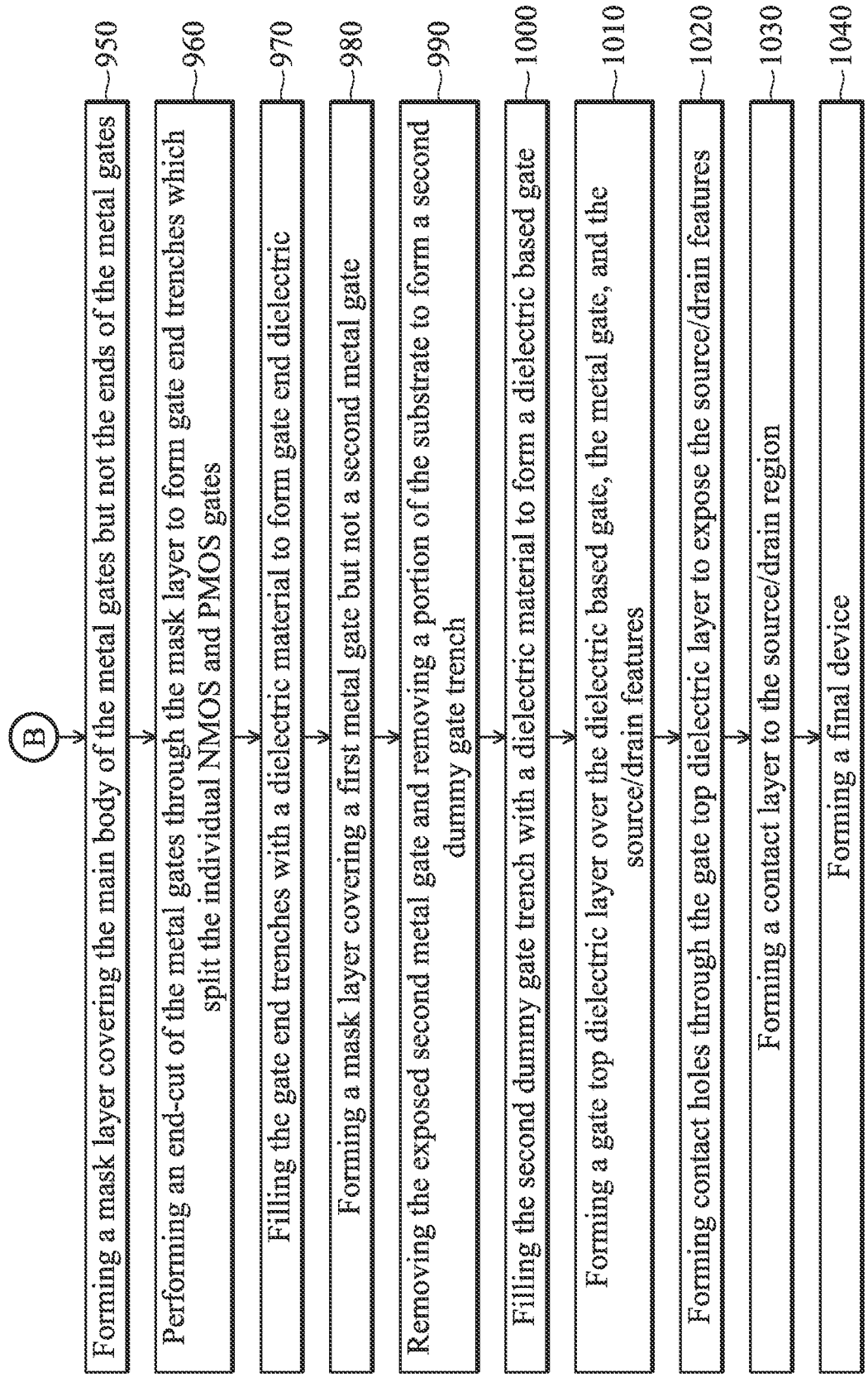
Figure 2A:
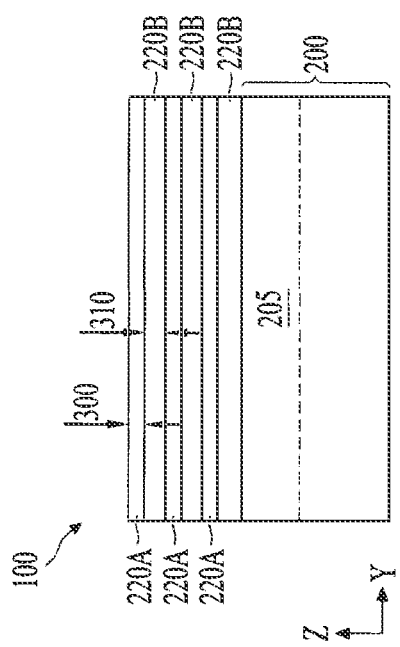
Figure 2B:
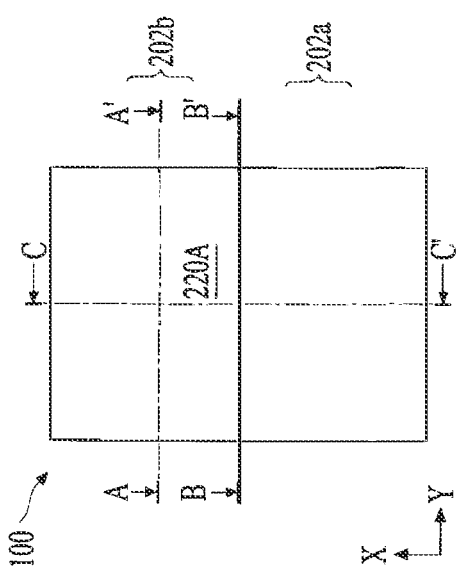
Figure 2C:
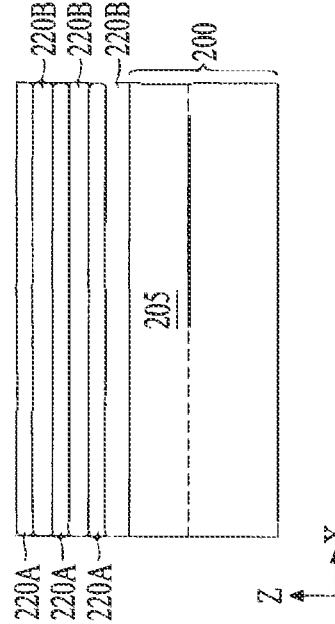
Figure 2D:
Figure 5B:
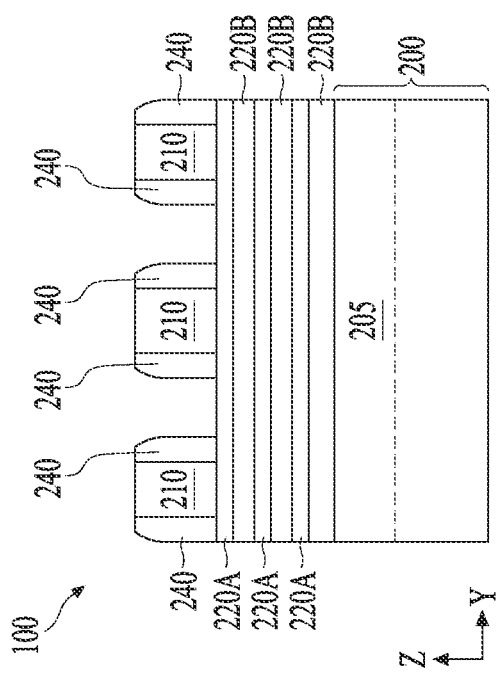
Figure 5D:
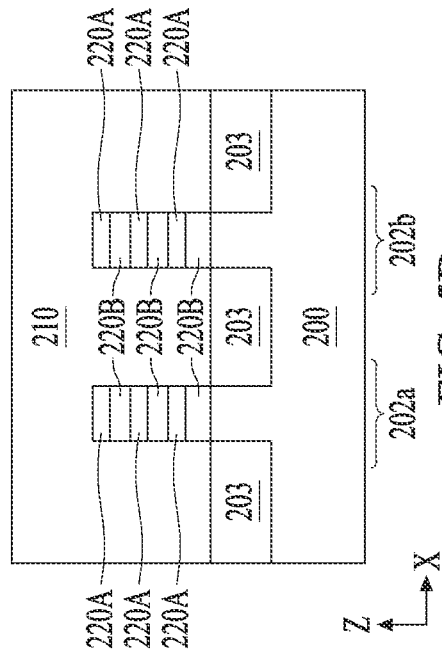
Figure 5A:
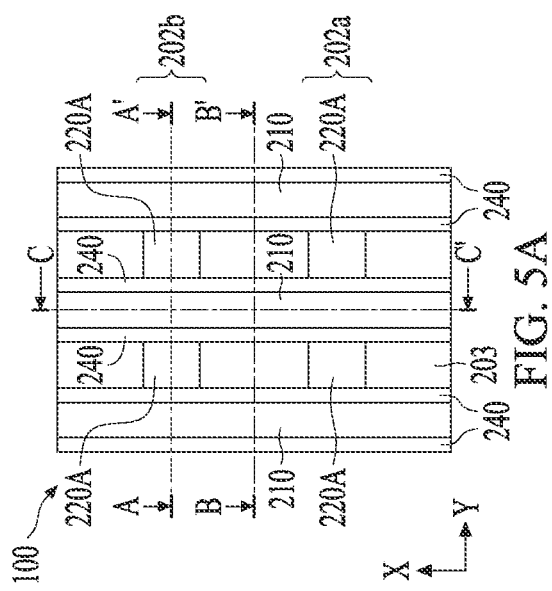
Figure 5C:
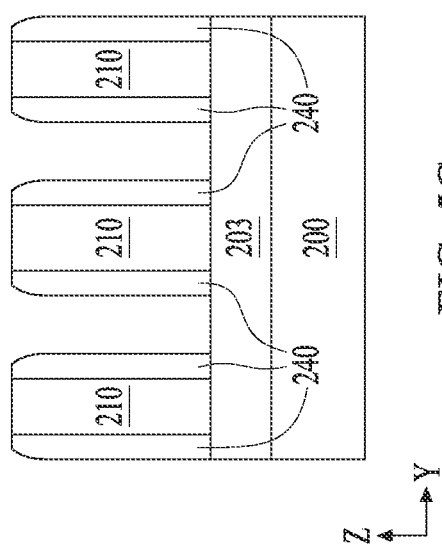

FIGS. 1A-1C are flow charts of an example method for fabricating an embodiment of a GAA device of the present disclosure according to some embodiments of the present disclosure. FIGS. 2A-29A are top views of an embodiment of a GAA device of the present disclosure constructed at various fabrication stages according to some embodiments of the present disclosure. FIGS. 2B-29B, 2C-29C, and 2D-29D are cross sectional views of an embodiment of a GAA device of the present disclosure along the lines A-A', B-B', and C-C' in FIGS. 2A-29A, respectively, according to some embodiments of the present disclosure.

Referring to block 810 of FIG. 1A and FIGS. 2A-2D, the GAA device 100 includes a substrate 200. In some embodiments, the substrate 200 contains a semiconductor material, such as bulk silicon (Si). Alternatively or additionally, another elementary semiconductor, such as germanium (Ge) in a crystalline structure, may also be included in the substrate 200. The substrate 200 may also include a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb), or combinations thereof. The substrate 200 may also include a semiconductor-on-insulator substrate, such as Si-on-insulator (SOI), SiGe-on-insulator (SGOI), Ge-on-insulator (GOI) substrates. Portions of the substrate 200 may be doped, such as the doped portions 205. The doped portions 205 may be doped with p-type dopants, such as boron (B) or boron fluoride (BF 3), or doped with n-type dopants, such as phosphorus (P) or arsenic (As). The doped portions 205 may also be doped with combinations of p-type and n-type dopants. The doped portions 205 may be formed directly on the substrate 200, in a p-well structure, in an n-well structure, in a dual-well structure, or using a raised structure.

Referring to block 820 of FIG. 1A and FIGS. 2A-2D, a stack of semiconductor layers 220A and 220B are formed over the substrate 200 in an interleaving or alternating fashion, extending vertically (e.g. along the Z-direction) from the substrate 200. For example, a semiconductor layer 220B is disposed over the substrate 200, a semiconductor layer 220A is disposed over the semiconductor layer 220B, and another semiconductor layer 220B is disposed over the semiconductor layer 220A, so on and so forth. In the depicted embodiments, there are three layers of semiconductor layers 220A and three layers of semiconductor layers 220B alternating between each other. However, there may be any appropriate number of layers in the stack. For example, there may be 2-10 layers of semiconductor layers 220A, alternating with 2-layers of semiconductor layers 220B in the stack. The material compositions of the semiconductor layers 220A and 220B are configured such that they have an etching selectivity in a subsequent etching process. For example, in some embodiments, the semiconductor layers 220A contain silicon germanium (SiGe), while the semiconductor layers 220B contain silicon (Si). In some other embodiments, the semiconductor layers 220B contain SiGe, while the semiconductor layers 220A contain Si. In the depicted embodiment, the semiconductor layers 220A each has a substantially uniform thickness, referred to as the thickness 300, while the semiconductor layers 220B each has a substantially uniform thickness, referred to as the thickness 310.

Referring to block 820 of FIG. 1A and FIGS. 3A-3D, the stack of semiconductor layers 220A and 220B are patterned into a plurality of fin structures, for example, into fin structures (or fins) 130a and 130b. Each of the fins 130a and 130b includes a stack of the semiconductor layers 220A and 220B disposed in an alternating manner with respect to one another. The fins 130a and 130b each extends lengthwise horizontally in a Y-direction and are separated from each other horizontally in an X-direction, as shown in FIGS. 3A and 3D. As illustrated in FIG. 3A, the fins may each have a lateral width along the X-direction, referred to as the width 350. It is understood that the X-direction and the Y-direction are horizontal directions that are perpendicular to each other, and that the Z-direction is a vertical direction that is orthogonal (or normal) to a horizontal XY plane defined by the X-direction and the Y-direction. The semiconductor substrate may have its top surface aligned in parallel to the XY plane.

The fins 130a and 130b may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins. The patterning may utilize multiple etching processes which may include a dry etching and/or wet etching. The regions in which the fins are formed will be used to form active devices through subsequent processing, and are thus referred to as active regions. For example, fin 130a is formed in the active region 202a, and the fin 130b is formed in the active region 202b. Both fins 130a and 130b are formed over the doped portions 205.

The structure 100 includes isolation features 203, which may be shallow trench isolation (STI) features. In some examples, the formation of the isolation features 203 includes etching trenches into the substrate 200 between the active regions and filling the trenches with one or more dielectric materials such as silicon oxide, silicon nitride, silicon oxynitride, other suitable materials, or combinations thereof. Any appropriate methods, such as a chemical vapor deposition (CVD) process, an atomic layer deposition (ALD) process, a physical vapor deposition (PVD) process, a plasma-enhanced CVD (PECVD) process, a plasma-enhanced ALD (PEALD) process, and/or combinations thereof may be used for depositing the isolation features 203. The isolation features 203 may have a multi-layer structure such as a thermal oxide liner layer over the substrate 200 and a filling layer (e.g., silicon nitride or silicon oxide) over the thermal oxide liner layer. Alternatively, the isolation features 203 may be formed using any other traditional isolation technologies. As illustrated in FIG. 3D, the fins 130a and 130b are located above the top surface of the isolation features 203 and the top surface of the doped portions 205.

Referring to block 830 of FIG. 1A and FIGS. 4A-4D, dummy gate structures 210 are formed over a portion of each of the fins 130a and 130b, and over the isolation features 203 in between the fins 130a and 130b. The dummy gate structures 210 may be configured to extend lengthwise in parallel to each other, for example, each along the X-direction. In some embodiments, as illustrated in FIG. 4D, the dummy gate structures each wraps around the top surface and side surfaces of each of the fins. The dummy gate structures 210 may include polysilicon. In some embodiments, the dummy gate structures 210 also include one or more mask layers, which are used to pattern the dummy gate electrode layers. The dummy gate structures 210 may undergo a gate replacement process through subsequent processing to form metal gates, such as a high-k metal gate, as discussed in greater detail below. Some of the dummy gate structures 210 may also undergo a second gate replacement process to form a dielectric based gate that electrically isolates the GAA device 100 from its neighboring devices, as also discussed in greater detail below. The dummy gate structures 210 may be formed by a procedure including deposition, lithography patterning, and etching processes. The deposition processes may include CVD, ALD, PVD, other suitable methods, and/or combinations thereof.

Referring to block 840 of FIG. 1A and FIGS. 5A-5D, gate spacers 240 are formed on the sidewalls of the dummy gate structures 210. The gate spacers 240 may include silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, or combinations thereof. The gate spacers 240 may include a single layer or a multi-layer structure. In some embodiments, the gate spacers 240 may have thicknesses in the range of a few nanometers (nm). In some embodiments, the gate spacers 240 may be formed by depositing a spacer layer (containing the dielectric material) over the dummy gate structures 210, followed by an anisotropic etching process to remove portions of the spacer layer from the top surfaces of the dummy gate structures 210. After the etching process, portions of the spacer layer on the sidewall surfaces of the dummy gate structures 210 substantially remain and become the gate spacers 240. In some embodiments, the anisotropic etching process is a dry (e.g. plasma) etching process. Additionally or alternatively, the formation of the gate spacers 240 may also involve chemical oxidation, thermal oxidation, ALD, CVD, and/or other suitable methods. In the active regions, the gate spacers 240 are formed over the top layer of the semiconductor layers 220A and 220B. Accordingly, the gate spacers 240 may also be interchangeably referred to as the top spacers 240. In some examples, one or more material layers (not shown) may also be formed between the dummy gate structures 210 and the corresponding top spacers. The one or more material layers may include an interfacial layer and/or a high-k dielectric layer.

Referring to block 850 of FIG. 1A and FIGS. 6A-6D, portions of the fins 130a and 130b exposed by the dummy gate structures 210 (e.g. in the source/drain regions) are at least partially recessed (or etched away) to form the source/drain trenches 151 for subsequent epitaxial source and drain growths. Meanwhile, the portions underneath the dummy gate structures 210 remain intact. In the depicted embodiments, the exposed portions of the fins 130a and 130b are etched away entirely. Accordingly, the top surface of the doped portions 205 of the substrate 200 in the source/drain regions are exposed in the source/drain trenches 151. The top surface of the doped portions 205 (and the bottom surface of the source/drain trenches 151) extends along the top surface of the substrate 200. Alternatively, in some other embodiments (not shown), the recess process removes only some, but not all, of the semiconductor layers 220A and 220B not covered by the dummy gate structures 210. In other words, the bottom surface of the source/drain trenches 151 extend above the top surface of the substrate 200. In yet some other embodiments (not shown), the recess process may remove not only the exposed fins 130a and 130b, but also remove a portion of the underlying doped region 205. In other words, the top surface of the doped portions 205 (and the bottom surface of the source/drain trenches 151) extends below the top surface of the substrate 200.

Figure 6A:
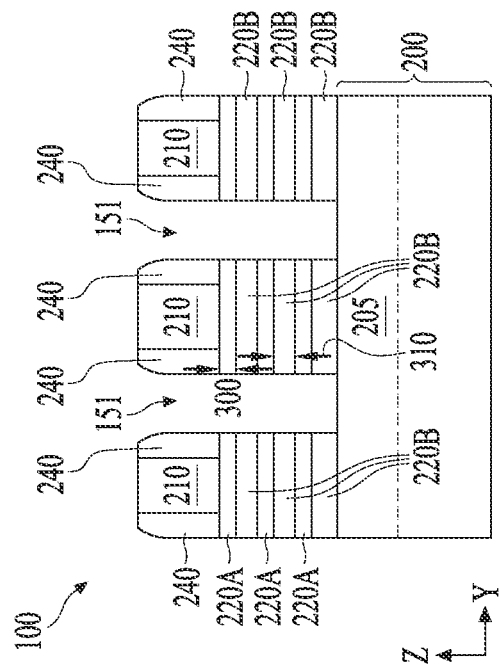
Figure 6D:
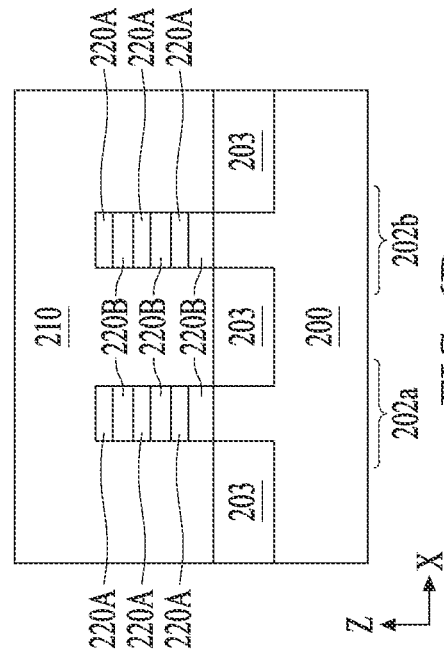
Figure 6C:
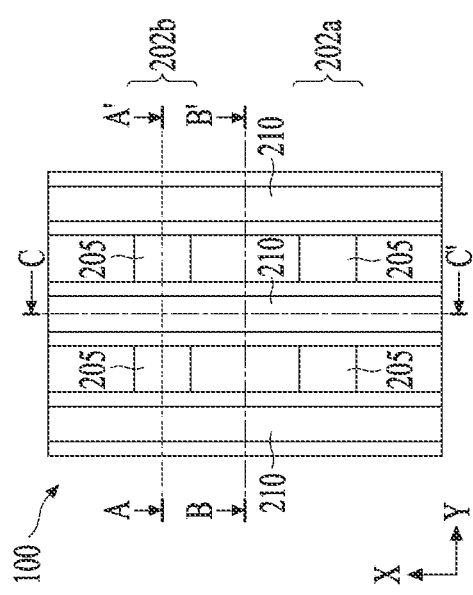
Figure 6B:
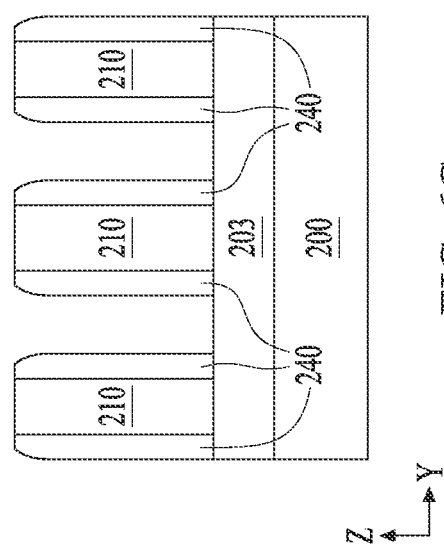

In the depicted embodiments, as illustrated in FIG. 6B, the remaining stack of semiconductor layers 220A and 220B are only present vertically beneath the dummy gate structures 210 (referred to as the "center portions") and vertically beneath the top spacers 240 (referred to as the "end portions" or interchangeably "side portions"). Accordingly, the portion of the semiconductor layers 220A vertically beneath the dummy gate structures 210 are referred to as the center portions 220A-center; while the portions of the semiconductor layers 220A vertically beneath the top spacers 240 are referred to as the end portions 220A-end. Similarly, the portion of the semiconductor layers 220B vertically beneath the dummy gate structures 210 are referred to as the center portions 220B-center; while the portions of the semiconductor layers 220B vertically beneath the top spacers 240 are referred to as the end portions 220B-end. In other words, the top spacers 240 are formed over the two end portions 220A-end of the topmost layer of the semiconductor layers 220A. The recess process may include multiple lithography and etching steps, and may use any suitable methods, such as dry etching and/or wet etching.

Figure 7A:
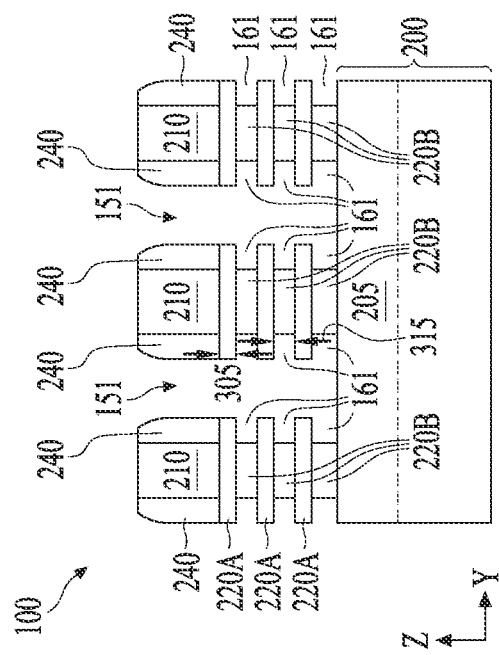
Figure 7C:
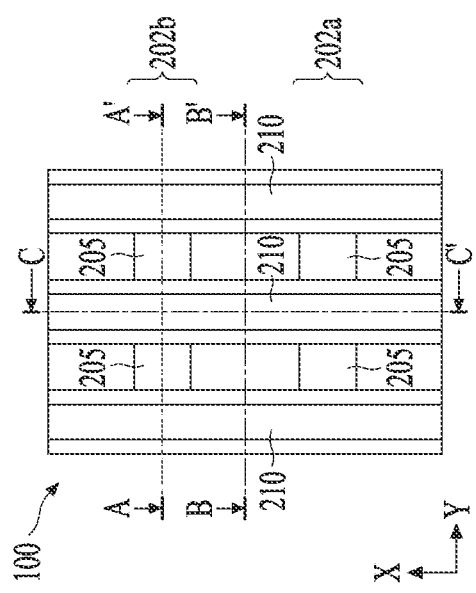
Figure 7B:
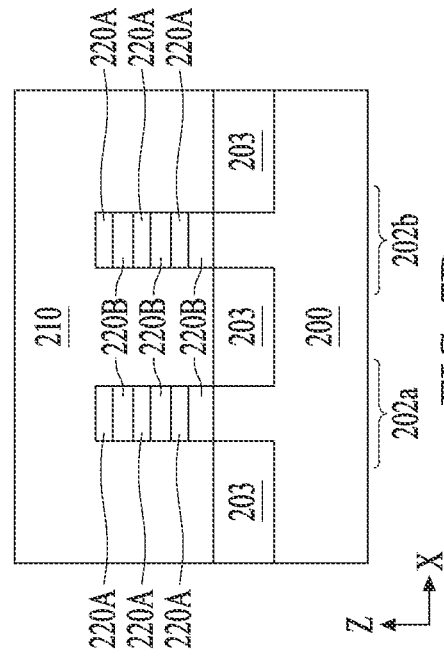
Figure 7D:
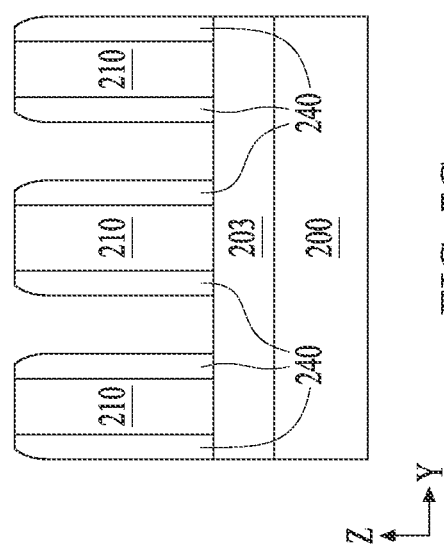
Figure 8A:
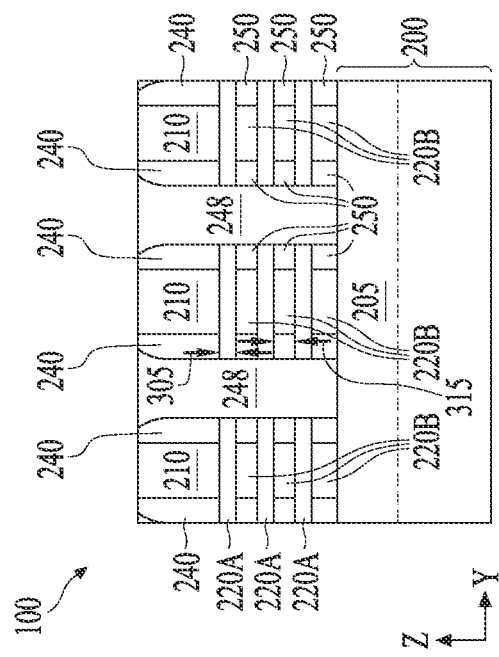
Figure 8C:
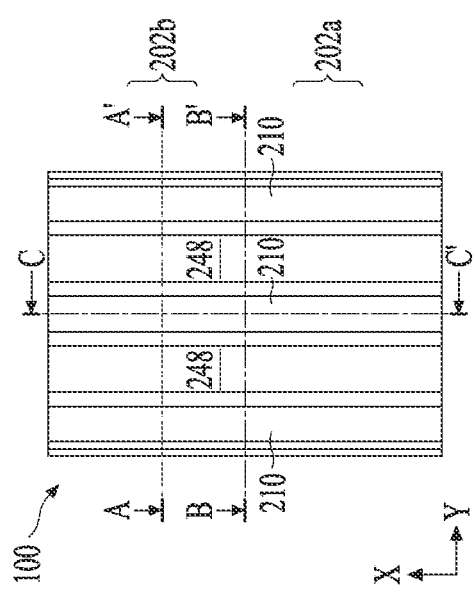
Figure 8B:
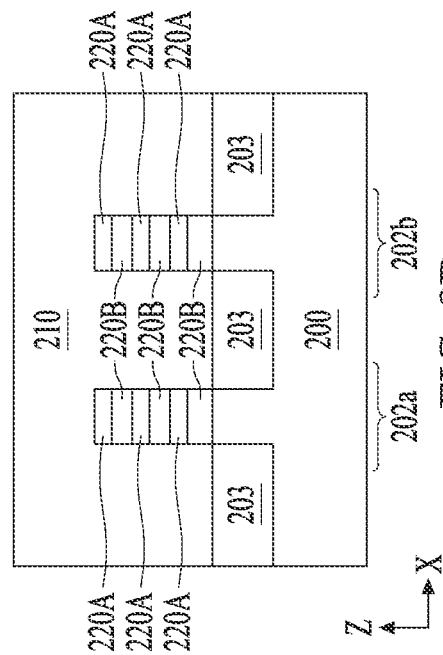
Figure 8D:
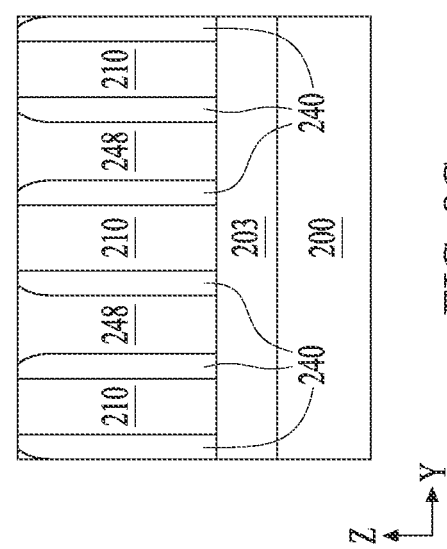

The formation of the source/drain trenches 151 exposes the sidewalls of the stack of semiconductor layers 220A and 220B. Referring to block 860 of FIG. 1A and FIGS. 7A-7D, portions of the semiconductor layers 220B are removed through the exposed sidewall surfaces in the trenches 151 via a selective etching process. The selective etching process may be any suitable processes, such as a wet etching or a dry etching process. The extent to which the semiconductor layers 220B are recessed (or the size of the portion removed) is determined by the processing conditions such as the duration the semiconductor layers 220B is exposed to an etching chemical. In the depicted embodiments, the duration is controlled such that the end portions 220B-end are removed in their entirety, while the center portions 220B-center remain substantially unchanged. In other words, the remaining portions of the semiconductor layers 220B each has a sidewall that extends along a sidewall of the dummy gate structures 210 (e.g. the sidewall in the XZ plane, defined by the X-direction and the Z-direction). As illustrated in FIG. 7B, the selective etching process creates openings 161, which extend the trenches 151 into areas beneath the semiconductor layers 220A and top spacers 240.

Meanwhile, the semiconductor layers 220A are only slightly affected during the selective etching process. For example, prior to the selective etching process, the end portions 220A-end each has a thickness 300, and end portions 220B-end each has a thickness 310 (see FIG. 6B). After the selective etching process, the end portions 220A-end has a thickness 305, and the openings 161 has a height 315 (or interchangeably referred to as thickness 315). Thickness 305 is only slightly smaller than thickness 300; and thickness 315 is only slightly larger than thickness 310. For example, thickness 305 may be about 1% to 10% smaller than thickness 300; and thickness 315 may be about 1% to 10% larger than thickness 310. As discussed above, the selectivity between the semiconductor layers 220A and 220B is made possible due to the different material compositions between these layers. For example, the semiconductor layers 220A may be etched away at a substantially faster rate (e.g. more than about 5 to about 10 times faster) than the semiconductor layers 220B.

As discussed above, the selective etching process may be a wet etching process. In an embodiment, the semiconductor layers 220A includes Si and the semiconductor layers 220B includes SiGe. A Standard Clean 1 (SC-1) solution may be used to selectively etch away the SiGe semiconductor layers 220B. For example, the SiGe semiconductor layers 220B may be etched away at a substantially faster rate than the Si semiconductor layers 220A. As a result, desired portions of the semiconductor layers 220B, e.g. the end portions 220B-end, are removed while the semiconductor layers 220A remain substantially unchanged. The SC-1 solution includes ammonia hydroxide ($NH_4OH$), hydrogen peroxide ($H_2O_2$), and water ($H_2O$). The etching duration is adjusted such that the size of the removed portions of SiGe layers are controlled. The optimal condition may be reached by additionally adjusting the etching temperature, dopant concentration, as well as other experimental parameters.

In another embodiment, the semiconductor layers 220A include SiGe and the semiconductor layers 220B includes Si. A cryogenic deep reactive ion etching (DRIE) process may be used to selectively etch away the Si semiconductor layer 220B. For example, the DRIE process may implement a sulfur hexafluoride—oxygen ($SF_6$—$O_2$) plasma. The optimal condition may be reached by adjusting the etching temperature, the power of the Inductively Coupled Plasma (ICP) power source and/or Radio Frequency (RF) power source, the ratio between the $SF_6$ concentration and the $O_2$ concentration, the dopant (such as boron) concentrations, as well as other experimental parameters. For example, the etching rate of a Si semiconductor layer 220B using a $SF_6$—$O_2$ plasma (with approximately 6% $O_2$) may exceed about 8 µm/min at a temperature of about −80° C.; while the SiGe semiconductor layers 220A are not substantially affected during the process.

Referring to block 870 of FIG. 1A and FIGS. 8A-8D, a dielectric material 248 is deposited into both the source/drain trenches 151 and the openings 161. The dielectric material 248 may be selected from $SiO_2$, SiON, SiOC, SiOCN, or combinations thereof. In some embodiments, the proper selection of the dielectric material 248 may be based on its dielectric constant. In an embodiment, this dielectric material 248 may have a dielectric constant lower than that of the top spacers 240. In some other embodiments, this dielectric material 248 may have a dielectric constant higher than that of the top spacers 240. This aspect of the dielectric material 248 will be further discussed later. The deposition of the dielectric material 248 may be any suitable methods, such as CVD, PVD, PECVD, MOCVD, ALD, PEALD, or combinations thereof. A CMP process may be performed to planarize the top surfaces of the device 100, and to expose the top surfaces of the dummy gate structures 210.

Referring to block 880 of FIG. 1A and FIGS. 9A-9D, the dielectric material 248 is etched back such that the top surface of the doped regions 205 is exposed. In the depicted embodiment, the etching-back is a self-aligned anisotropic dry-etching process, such that the top spacers 240 are used as the masking element. Alternatively, a different masking element (e.g. a photoresist) may be used. The etching-back completely removes the dielectric materials 248 within the trenches 151 but does not substantially affect the dielectric materials 248 within the trenches 161 (see FIG. 8B). As a result, the dielectric materials 248 filled in the openings 161 become the inner spacers 250. In other words, the inner spacers 250 are formed between vertically adjacent end portions 220A-end of the semiconductor layers 220A (see FIG. 9B). In the present embodiment, the inner spacers 250 are only present in the active regions. As illustrated in FIG. 9C, no inner spacers 250 are present over the isolation features 203. Rather, only top spacers 240 are present over the isolation features 203.

As illustrated in FIG. 9B, the sidewall surfaces of the inner spacers 250, the top spacers 240, and the semiconductor layers 220A form continuous sidewall surfaces 171. The side wall surfaces 171 include both semiconductor materials from the semiconductor layers 220A and dielectric materials from the top spacers 240 and the inner spacers 250. In an embodiment, the semiconductor layers 220A may have substantially maintained the thickness 305, while the inner spacers 250 may have about the same thickness 315 as the openings 161 (see FIG. 7B). As described above, thickness 305 is largely determined by thickness 300, and is slightly smaller (such as 1% to 10% smaller) than the thickness 300. Similarly, thickness 315 is largely determined by thickness 310, and is slightly larger (such as 1% to 10% larger) than thickness 310. The ratio $r_1$, defined by thickness 305 over thickness 315, may be used in controlling the optimization of epitaxial source/drain features. This is described in more details below.

Figure 10A:
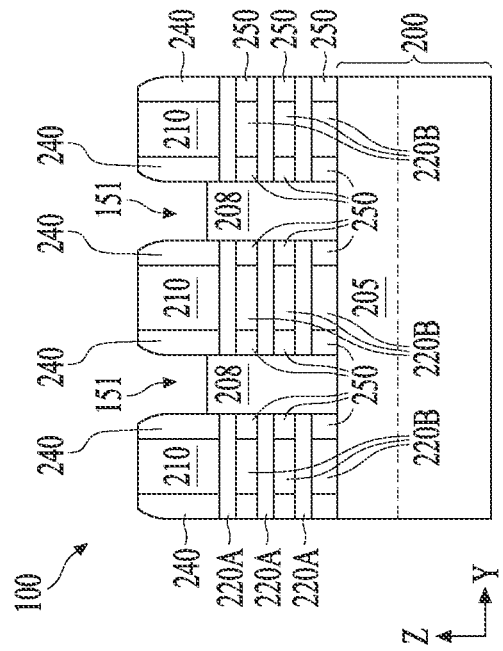
Figure 10B:
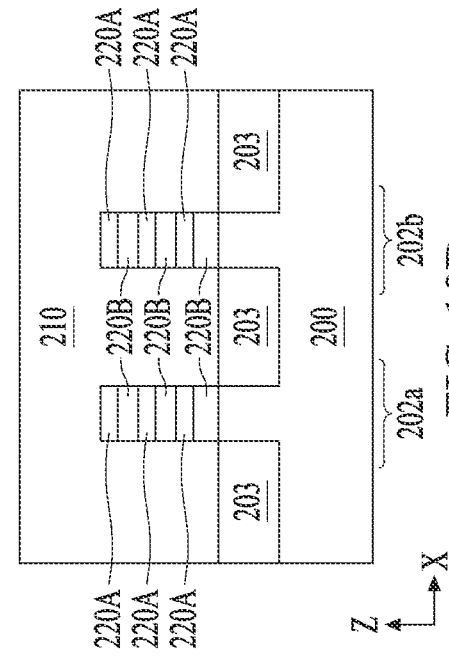
Figure 10C:
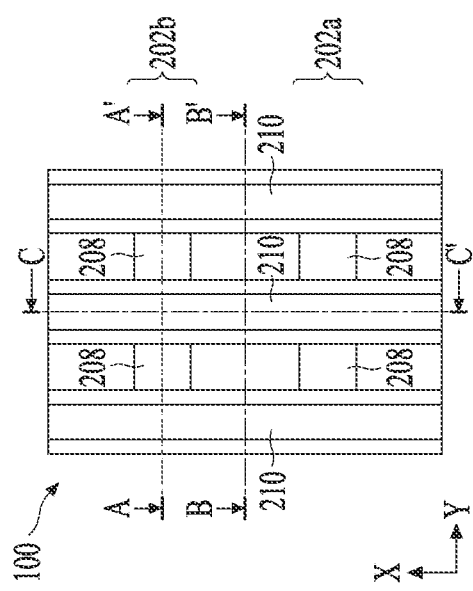
Figure 10D:
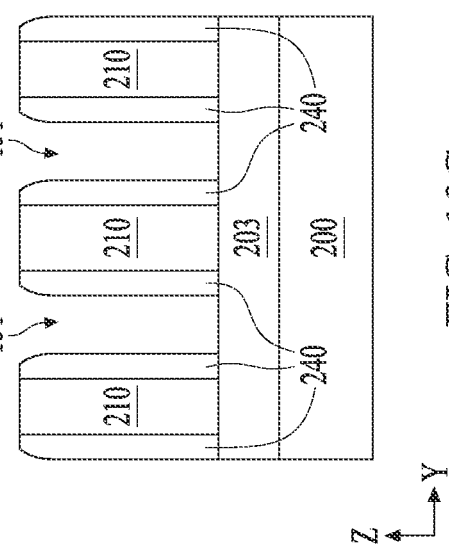
Figure 11A:
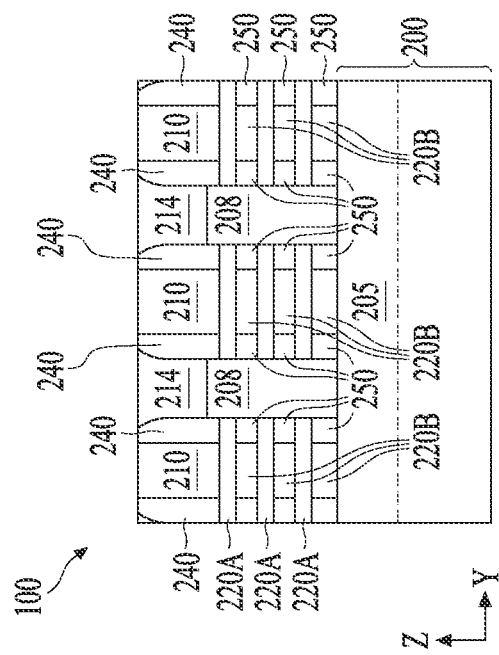
Figure 11B:
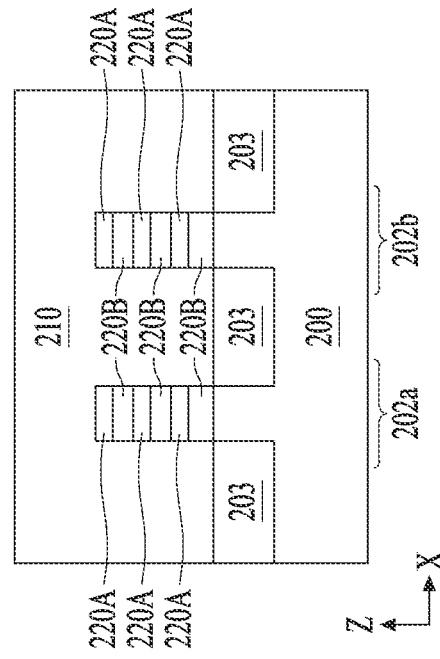
Figure 11C:
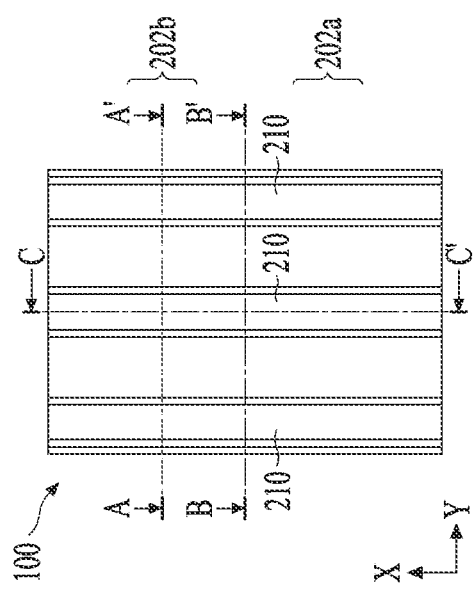
Figure 11D:
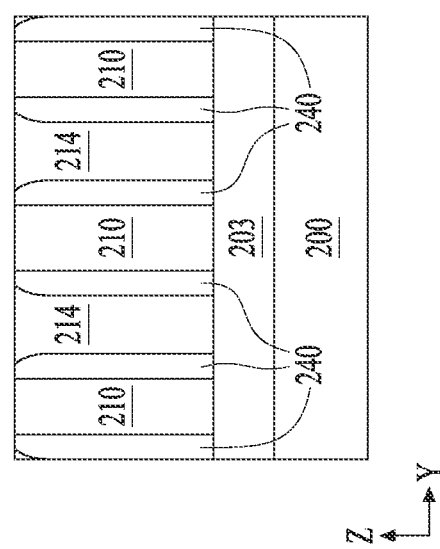
Figure 12B:
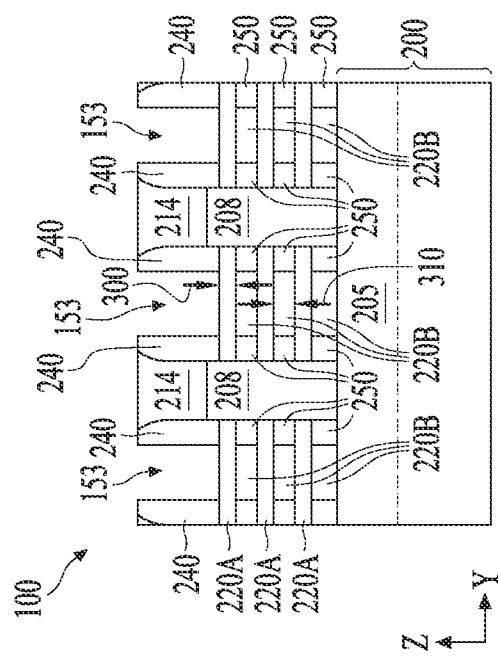
Figure 12D:
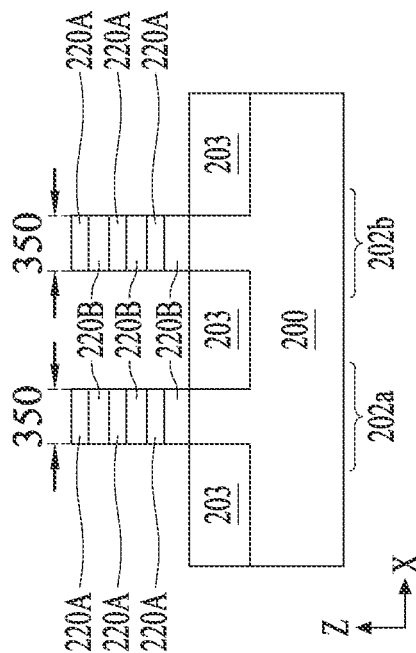
Figure 12A:
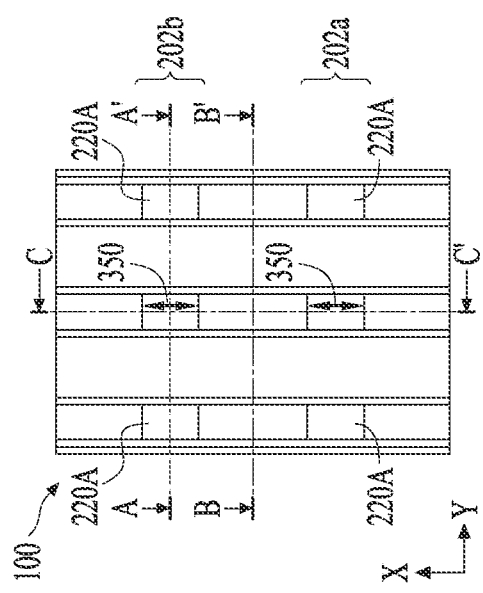
Figure 12C:
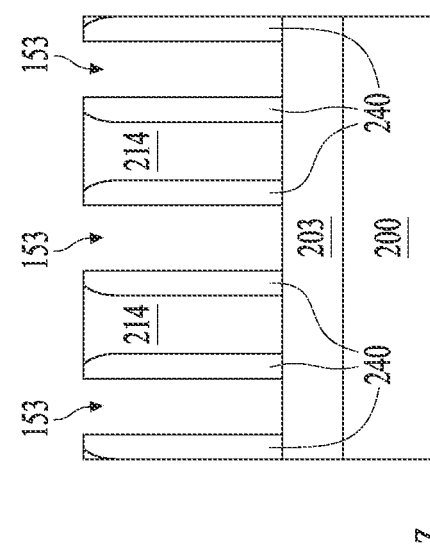
Figure 13A:
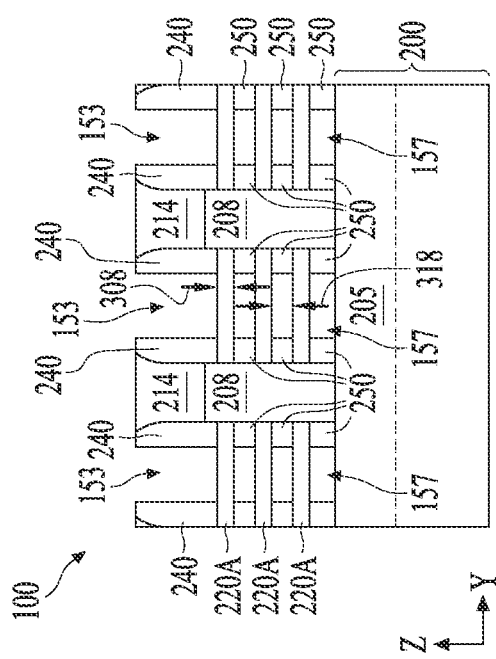
Figure 13D:
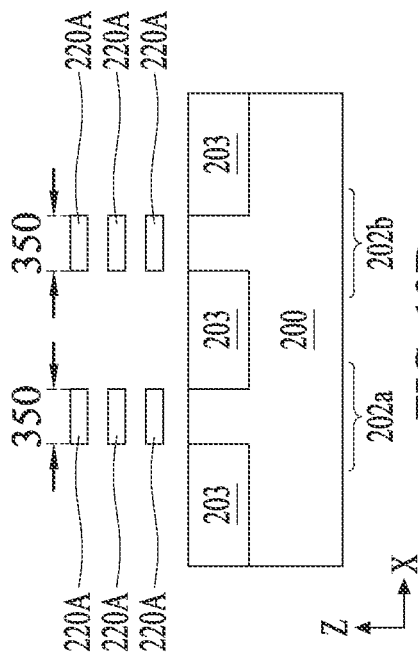
Figure 13C:
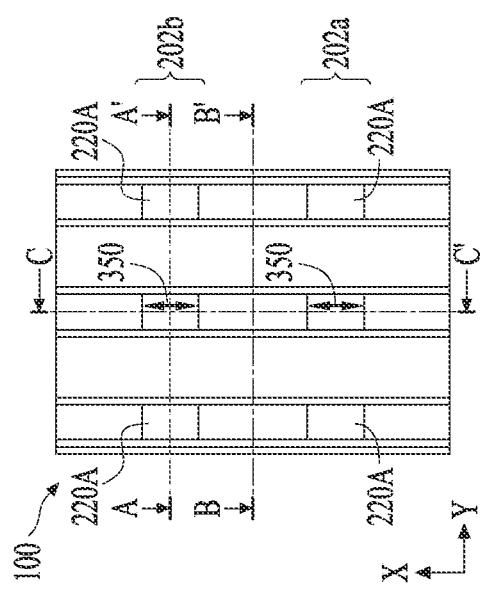
Figure 13B:
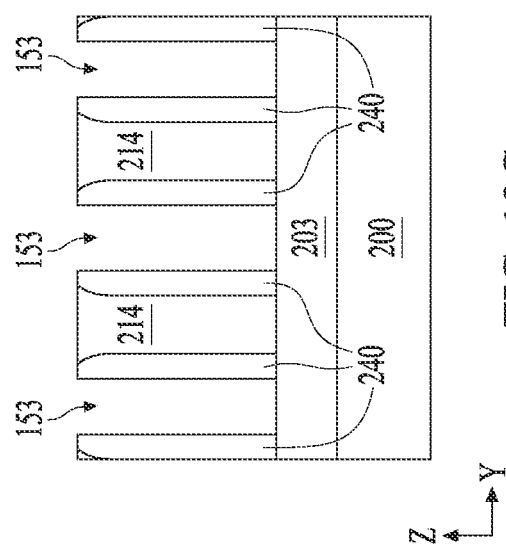
Figure 14B:
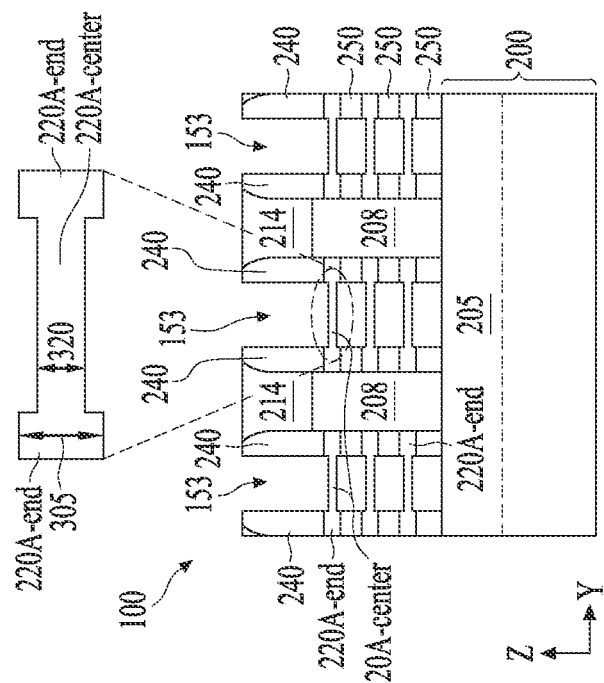
Figure 14D:
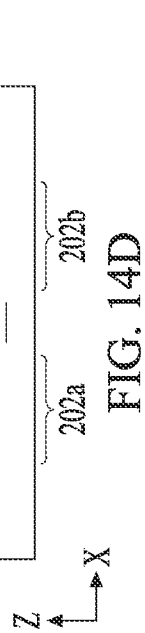
Figure 14A:
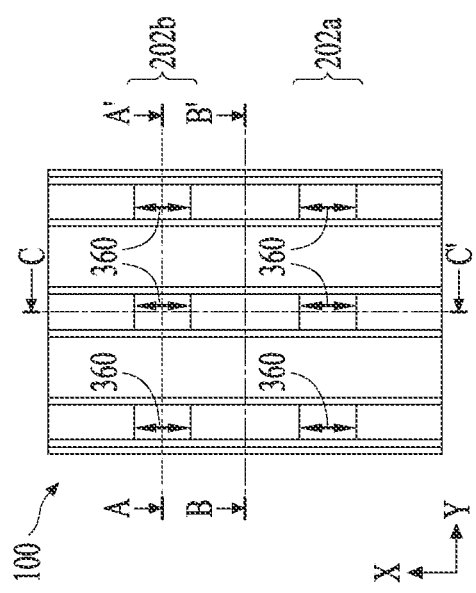
Figure 14C:
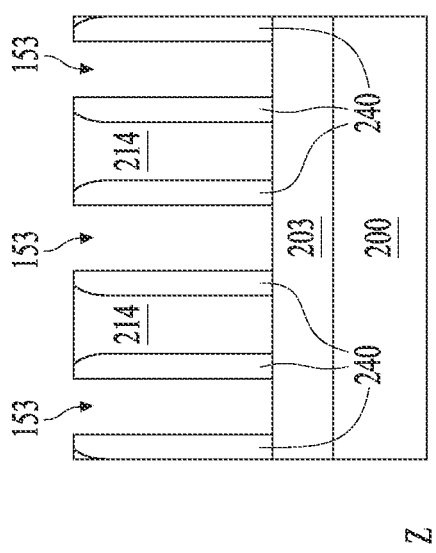
Figure 15B:
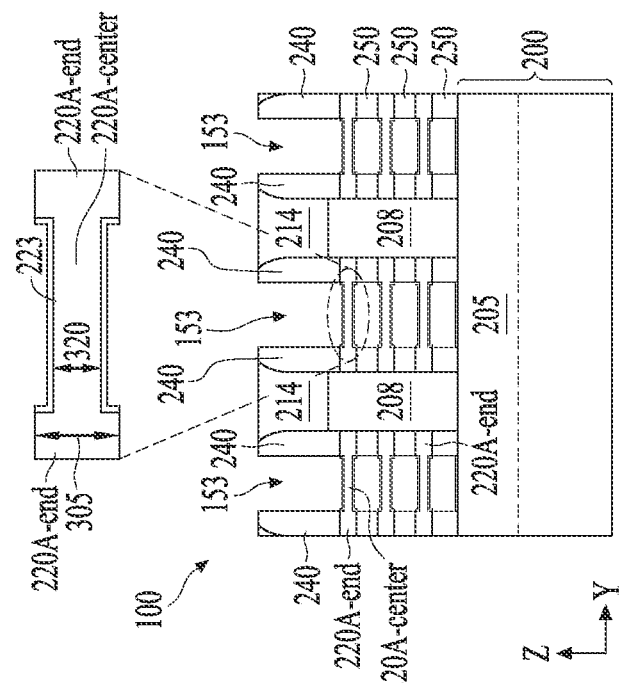
Figure 15D:
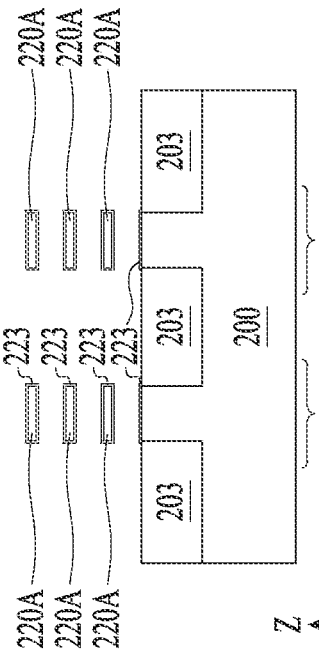
Figure 15A:
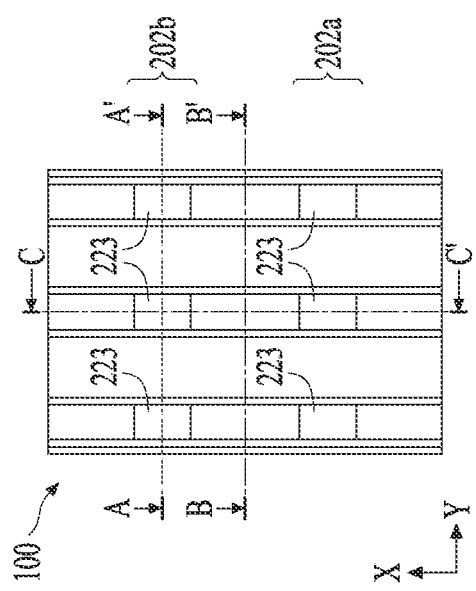
Figure 15C:
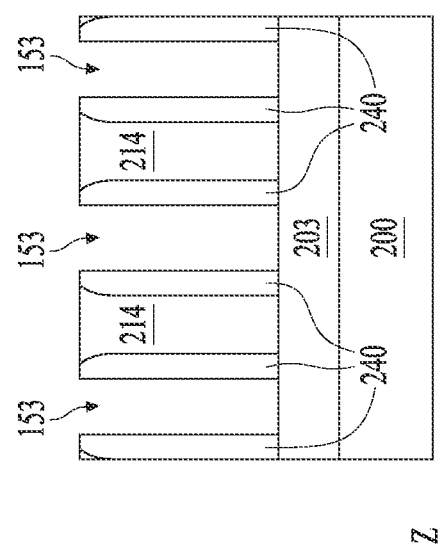
Figure 16B:
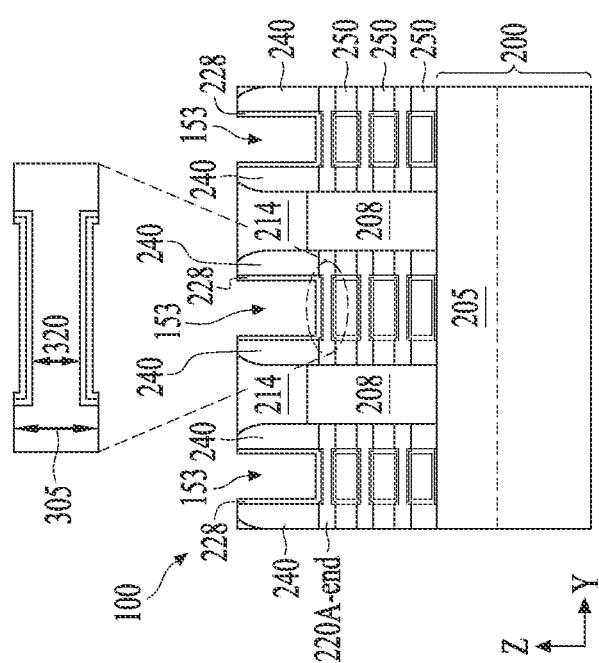
Figure 16D:
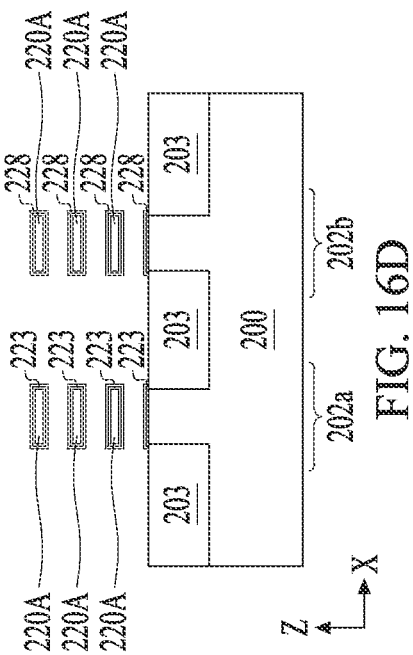
Figure 16A:
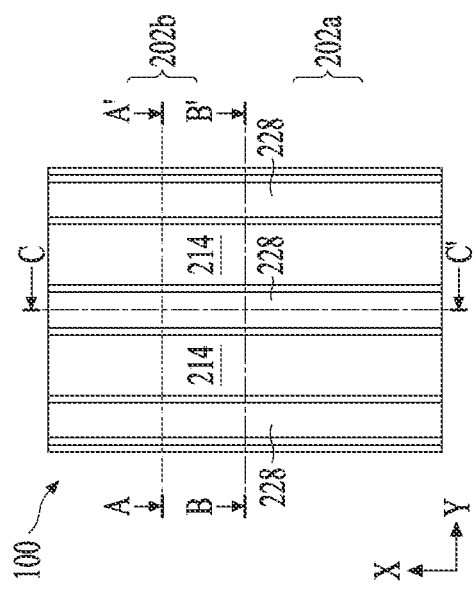
Figure 16C:
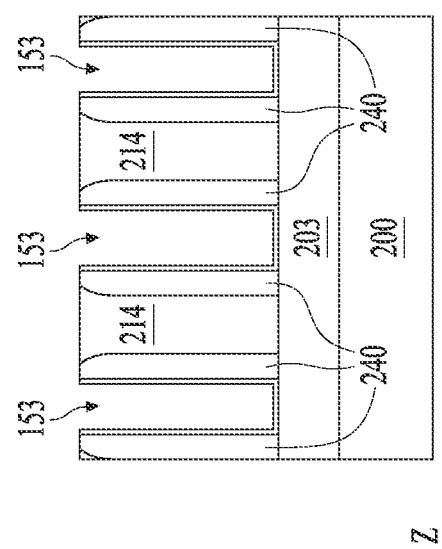
Figure 17B:
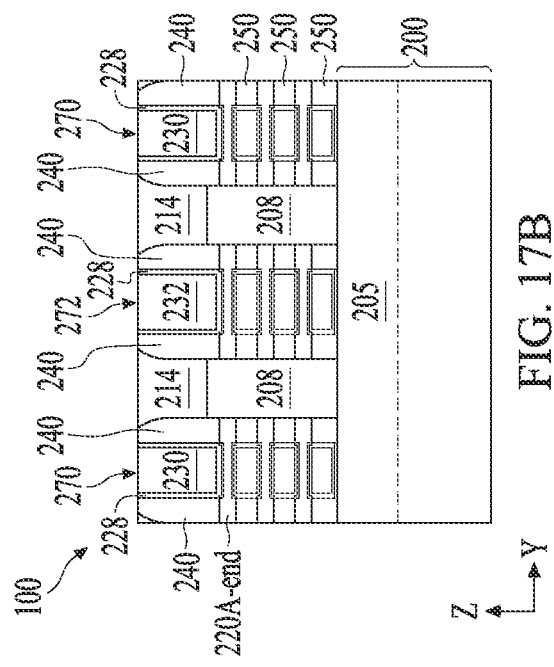
Figure 17D:
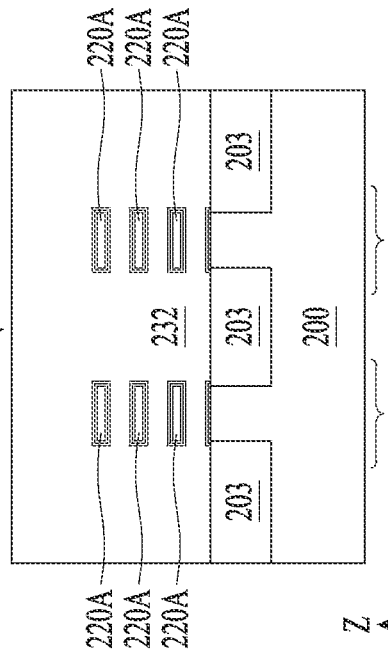
Figure 17A:
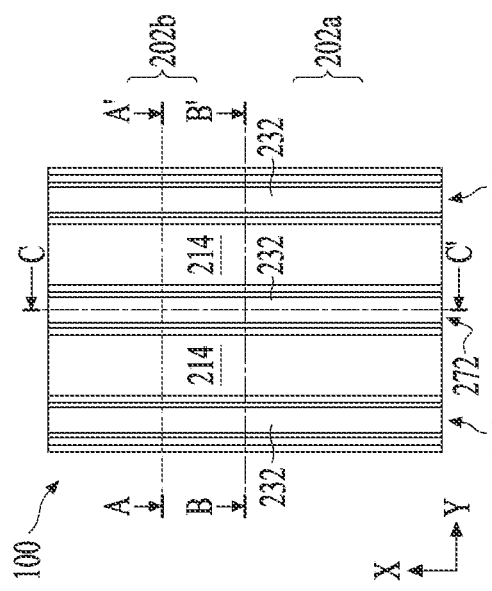
Figure 17C:
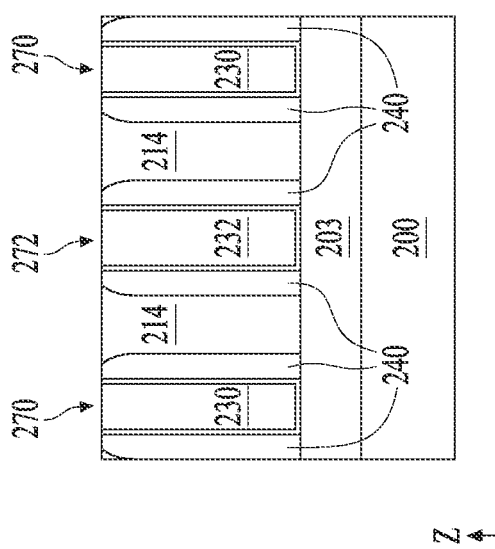
Figure 18A:
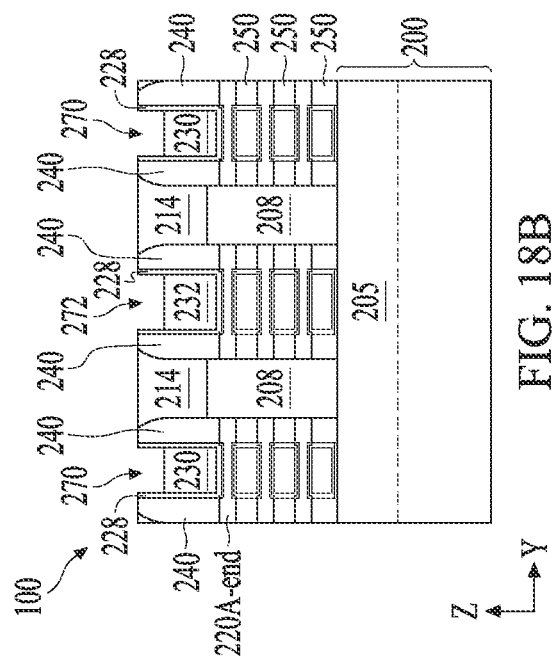
Figure 18C:
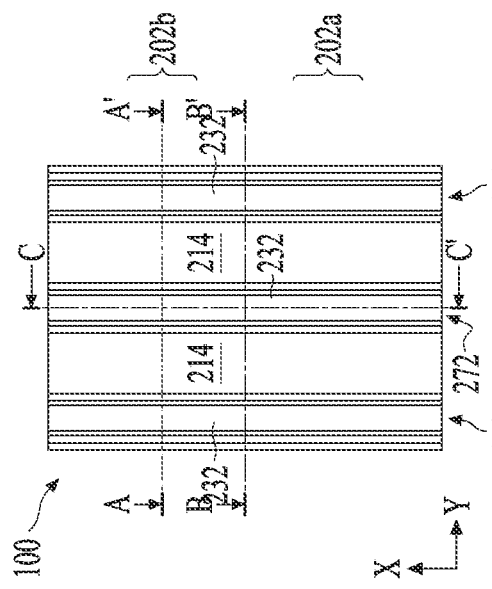
Figure 18B:
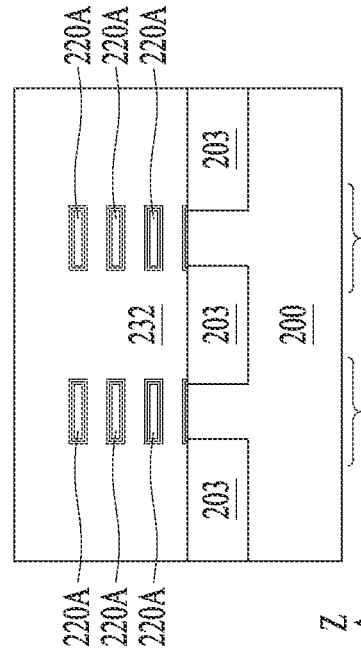
Figure 18D:
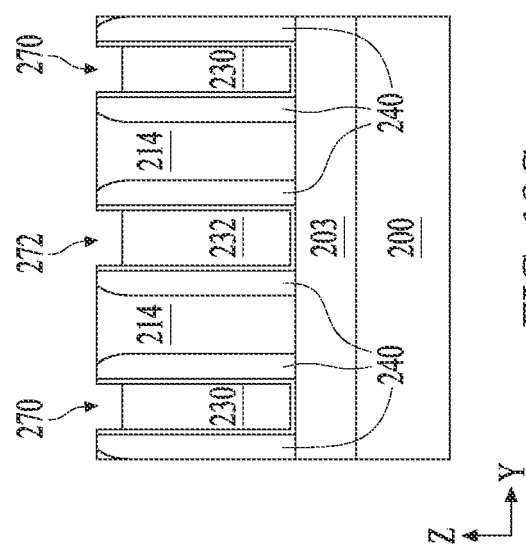
Figure 20A:
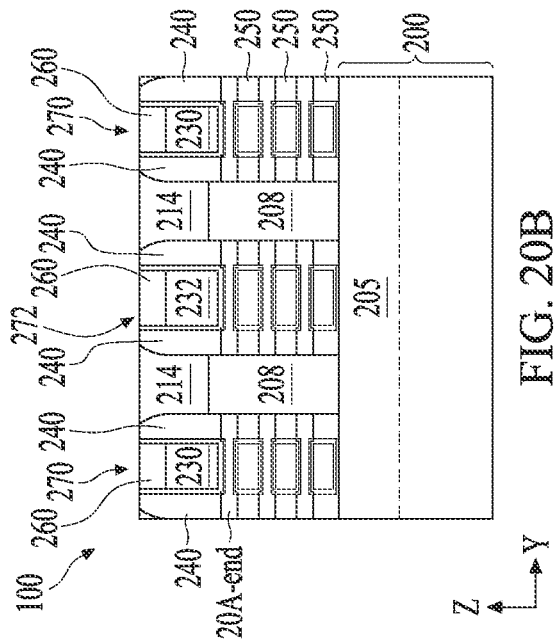
Figure 20B:
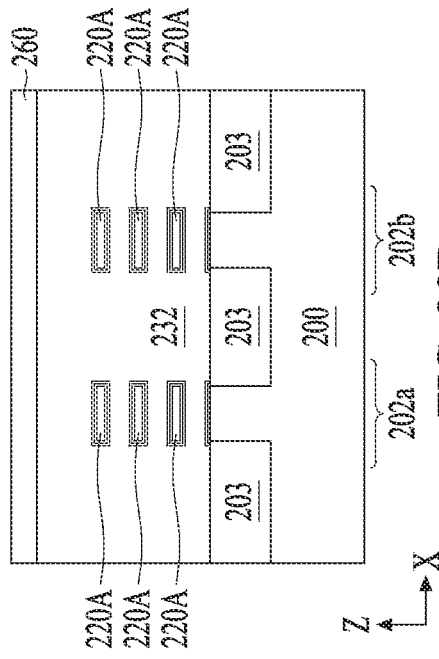
Figure 20C:
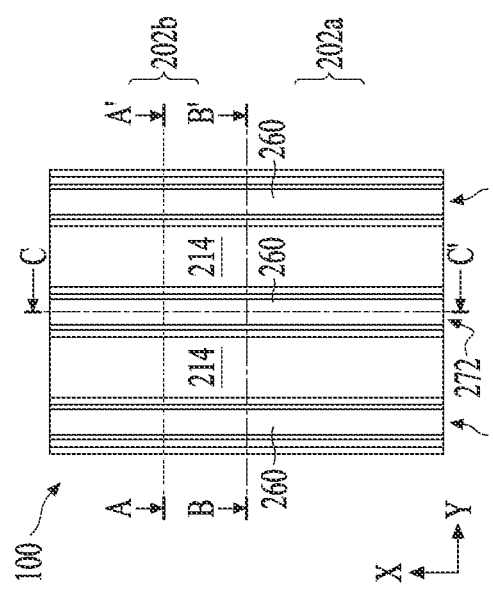
Figure 20D:
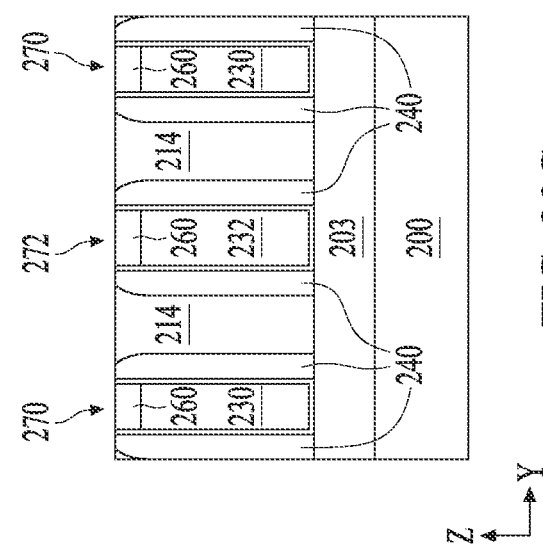
Figure 22A:
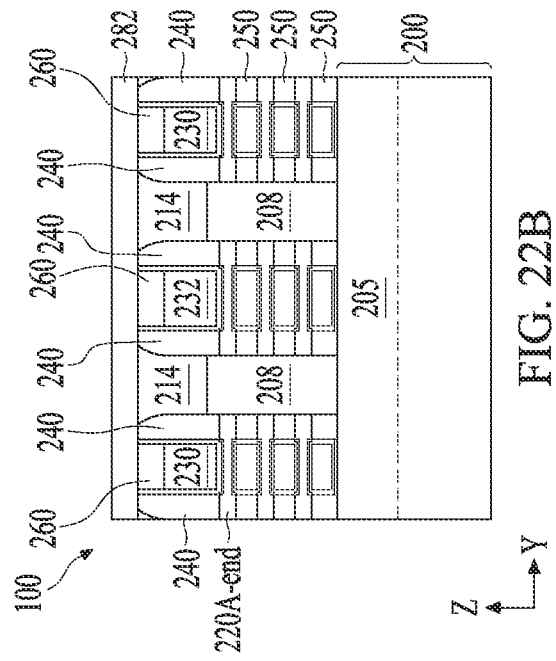
Figure 22B:
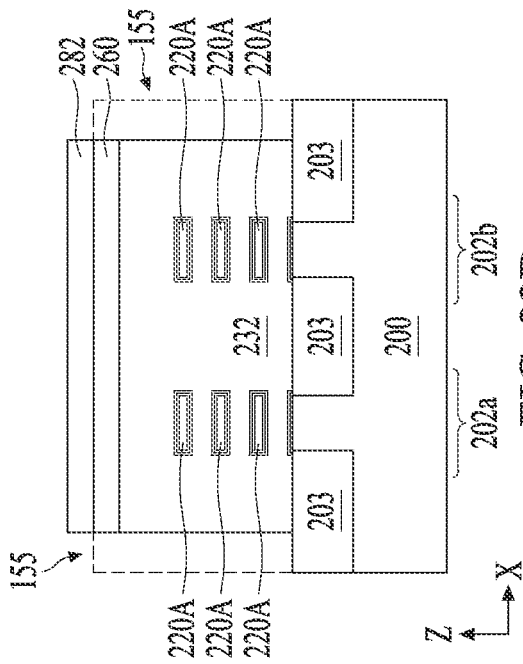
Figure 22C:
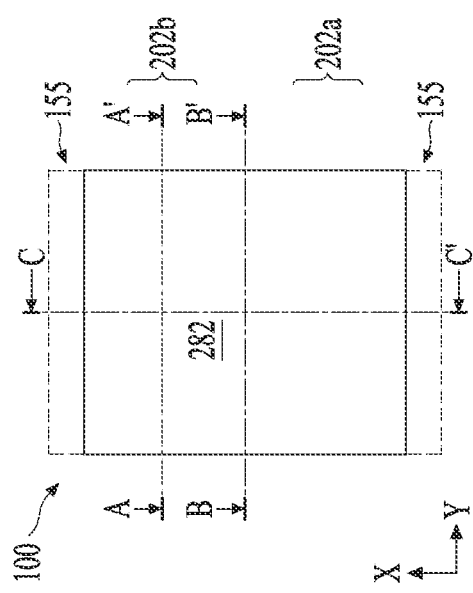
Figure 22D:
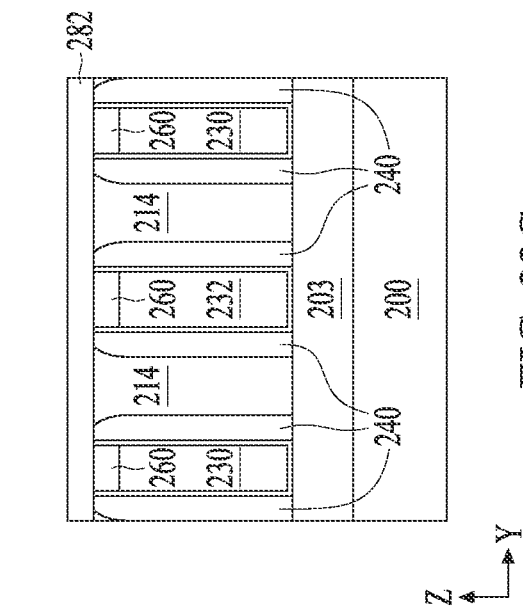
Figure 23A:
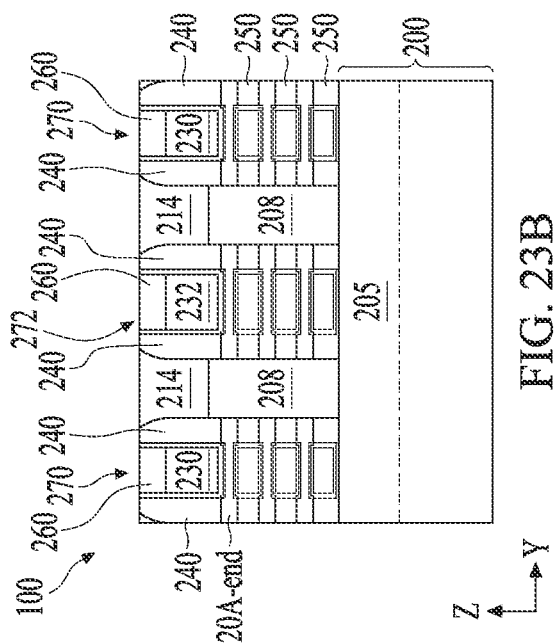
Figure 23C:
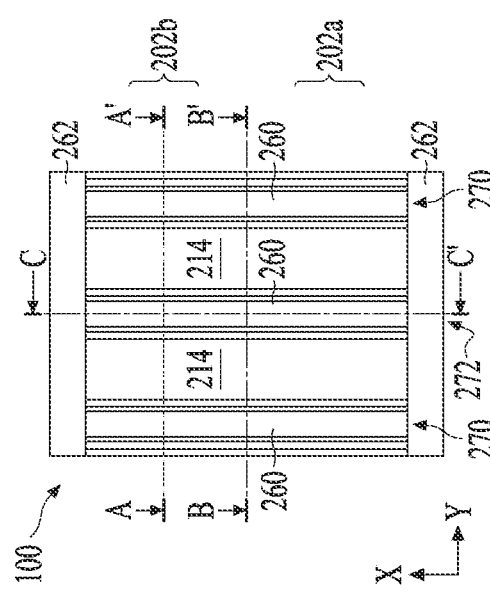
Figure 23B:
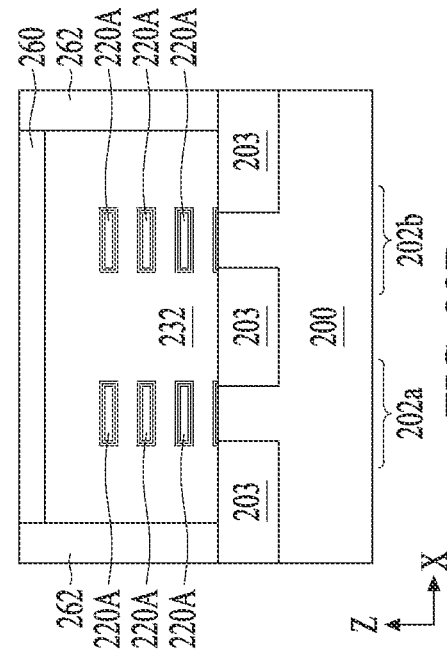
Figure 23D:
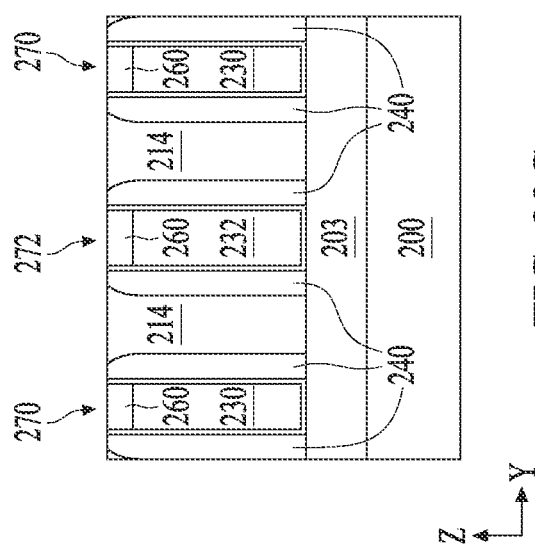
Figure 24A:
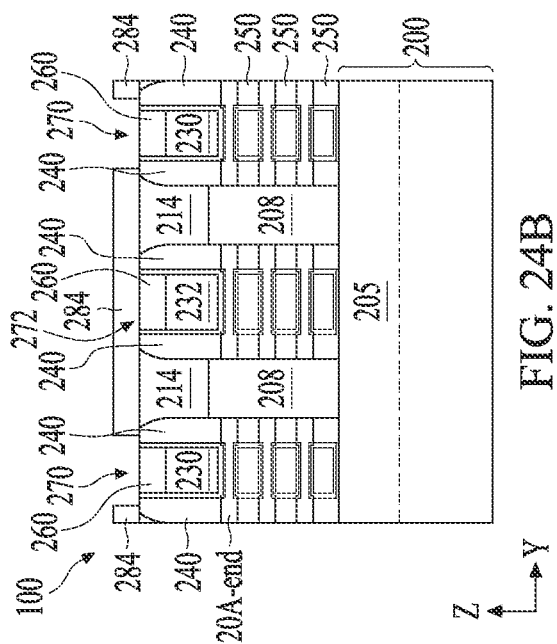
Figure 24B:
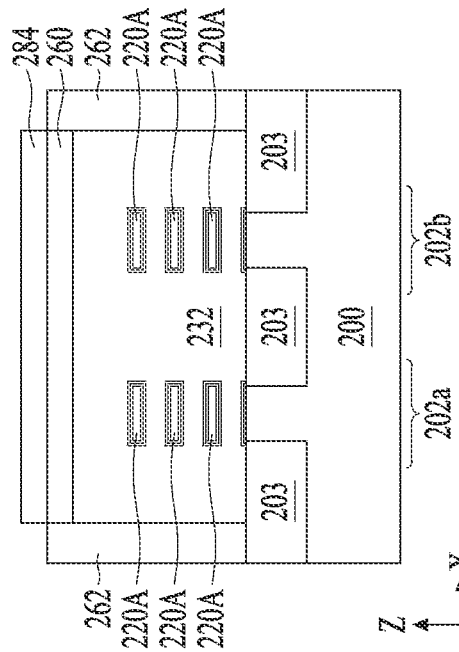
Figure 24C:
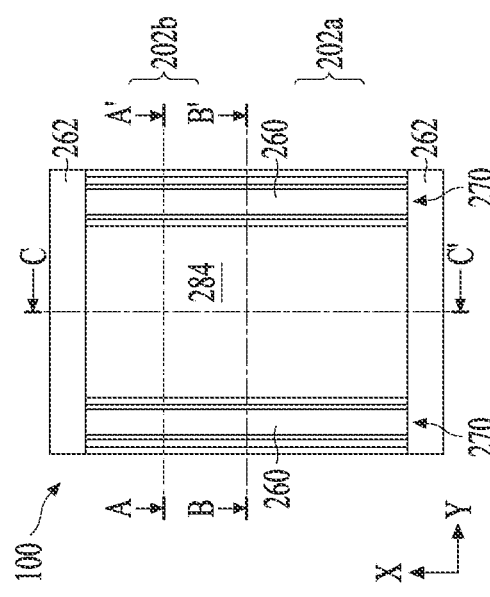
Figure 24D:
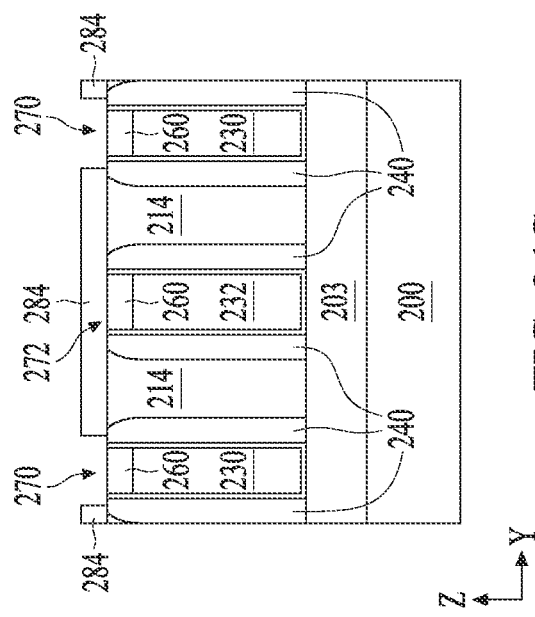
Figure 25A:
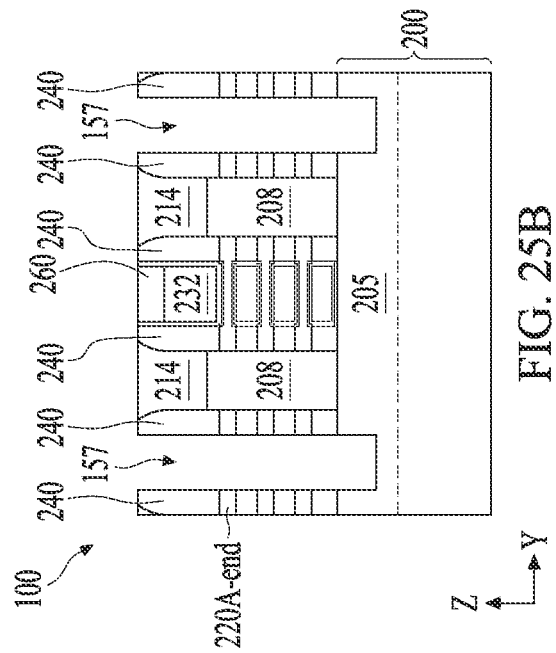
Figure 25B:
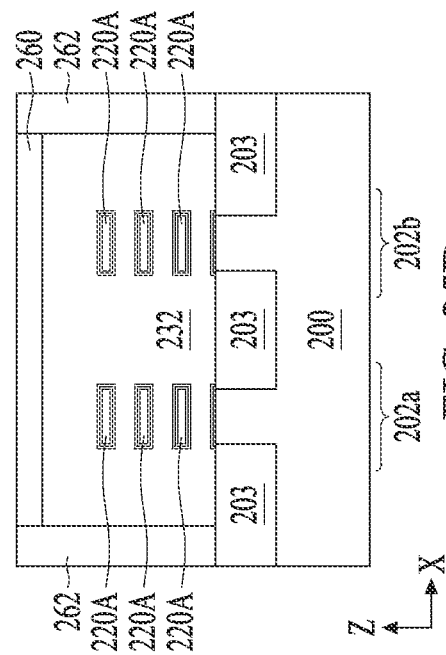
Figure 25C:
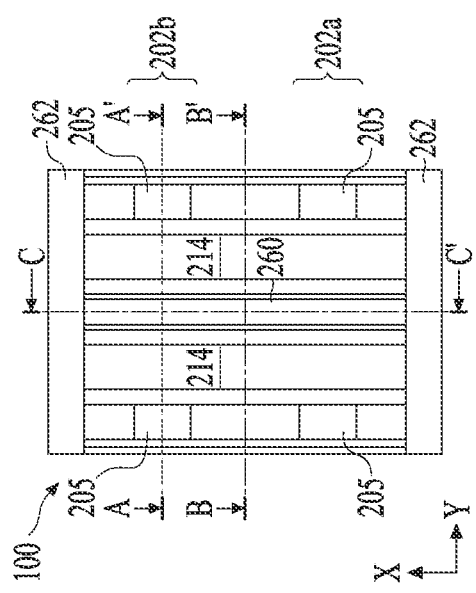
Figure 25D:
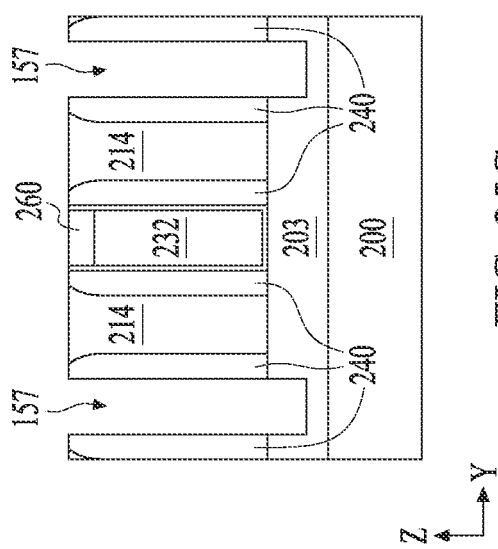
Figure 28B:
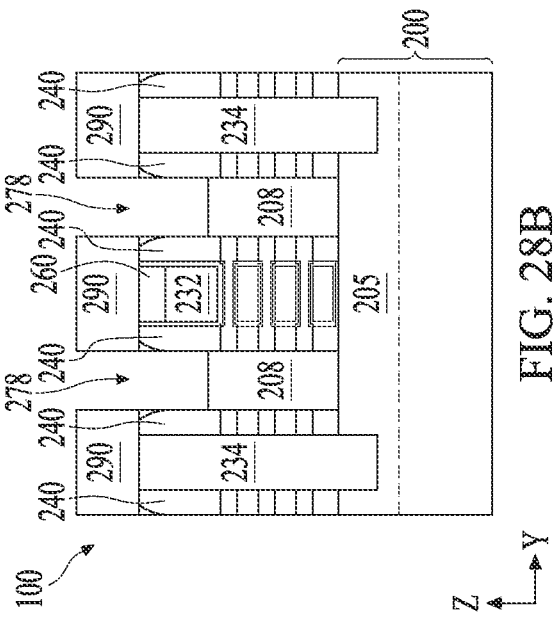
Figure 28D:
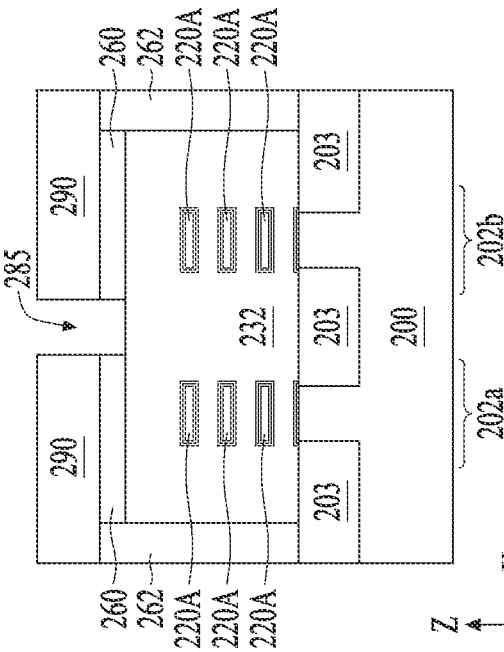
Figure 28A:
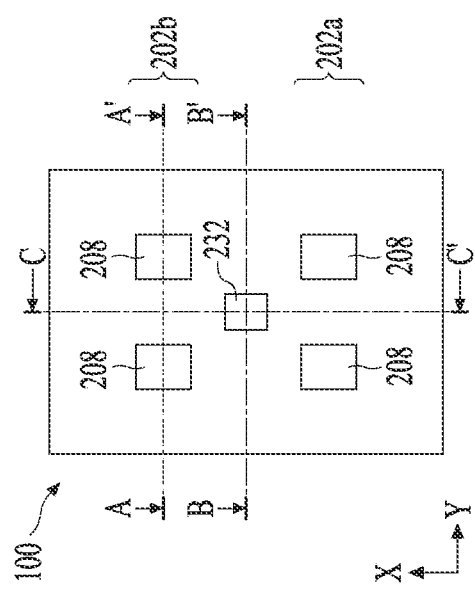
Figure 28C:
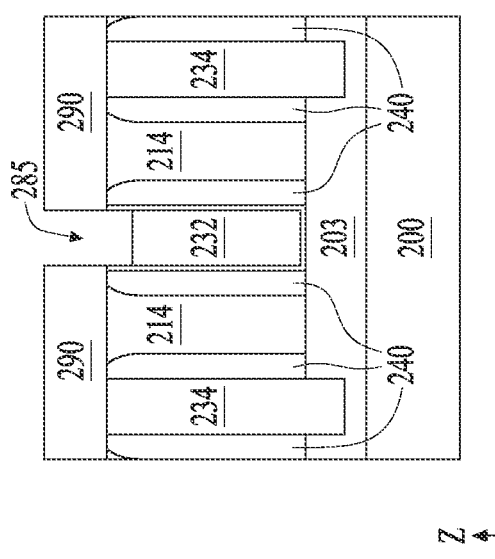
Figure 30A:
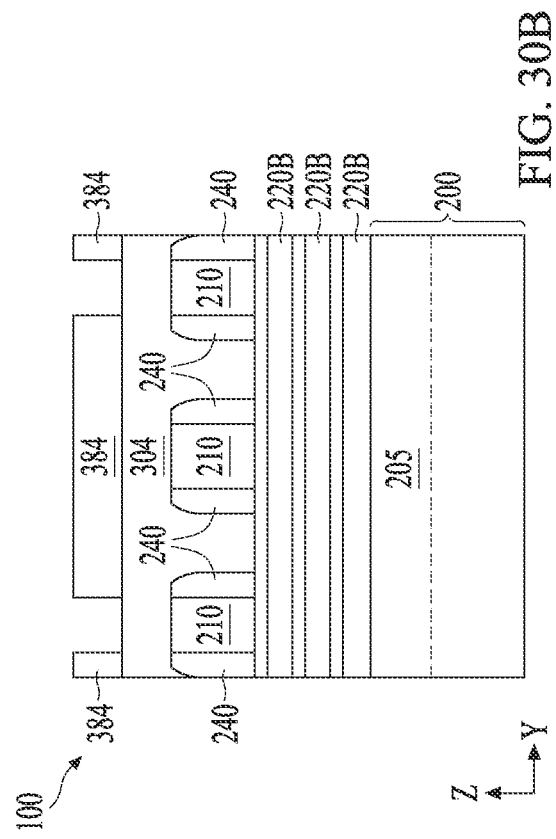
Figure 30B:
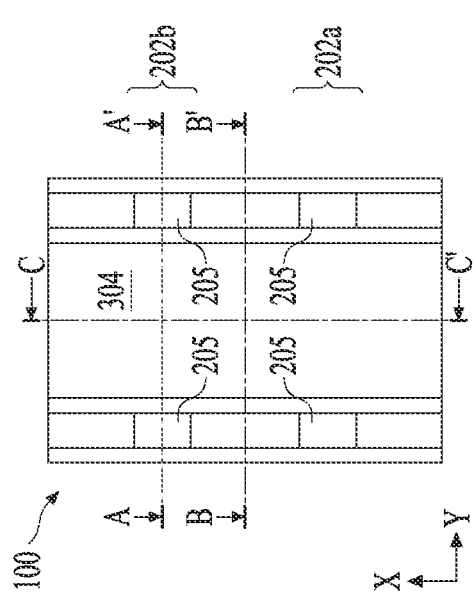
Figure 30C:
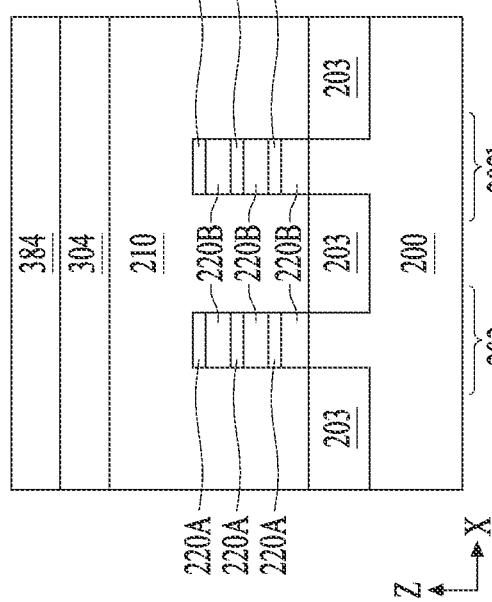
Figure 30D:
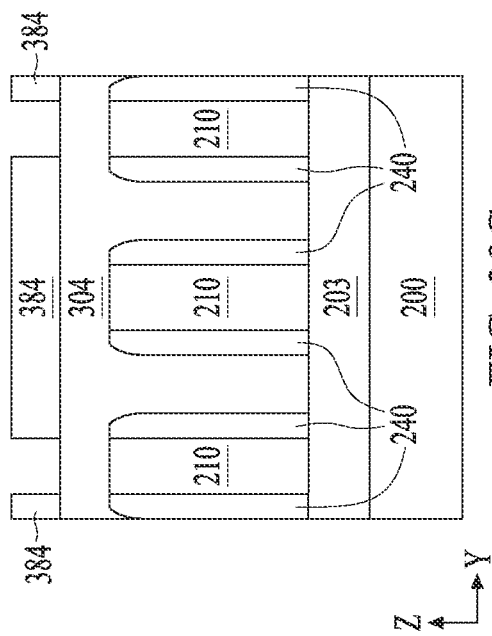
Figure 31A:
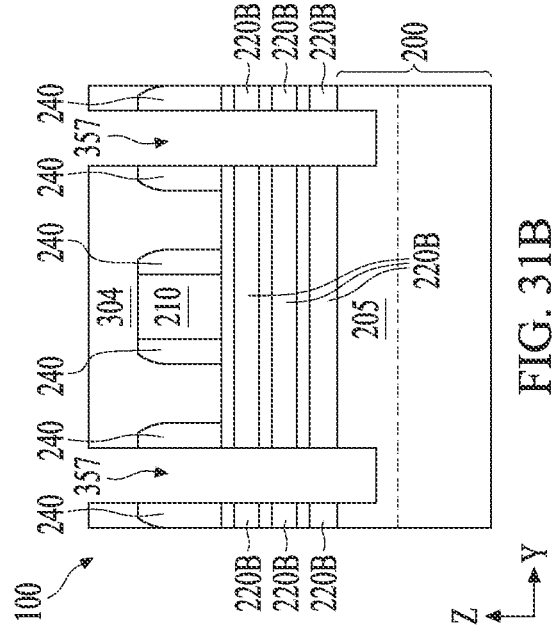
Figure 31B:
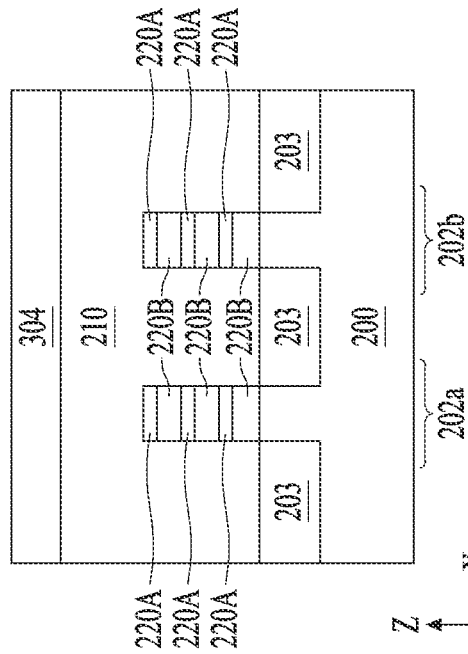
Figure 31C:
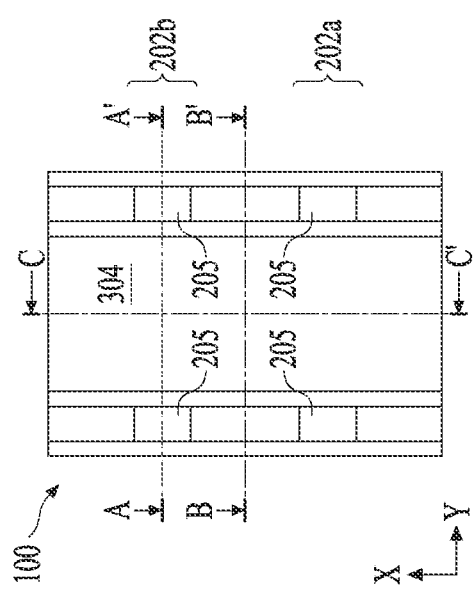
Figure 31D:
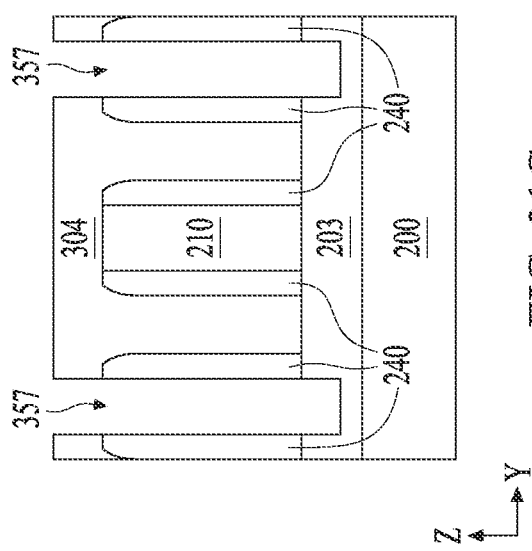
Figure 32A:
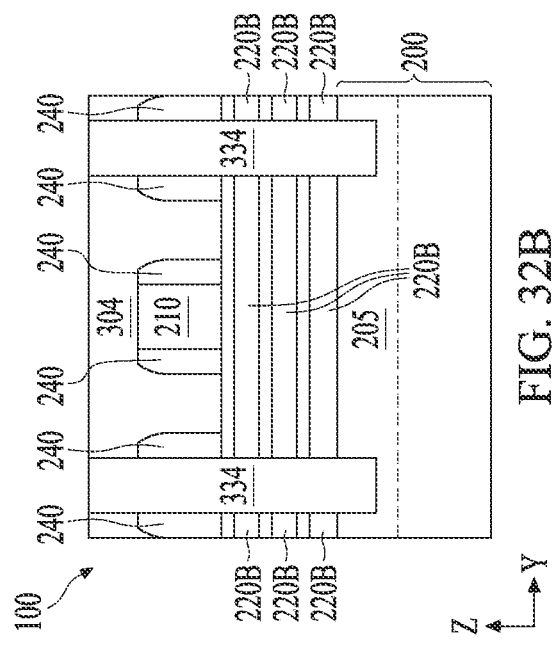
Figure 32B:
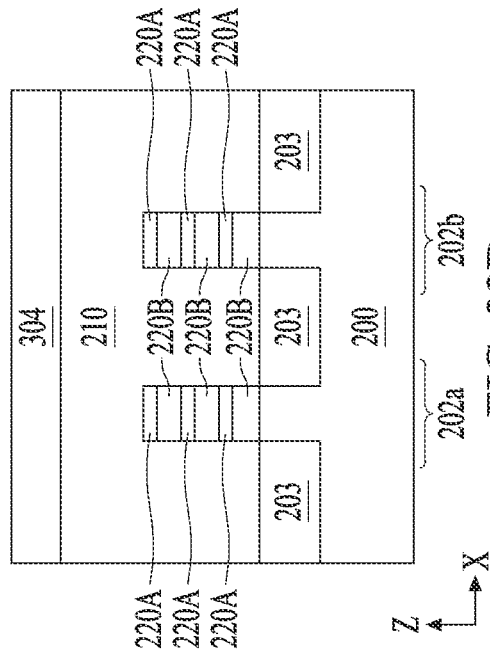
Figure 32C:
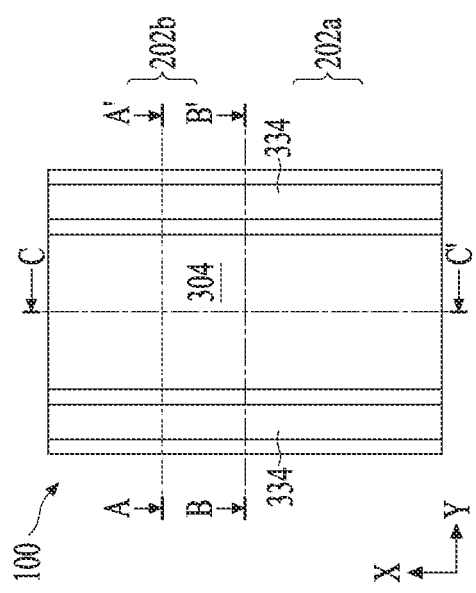
Figure 32D:
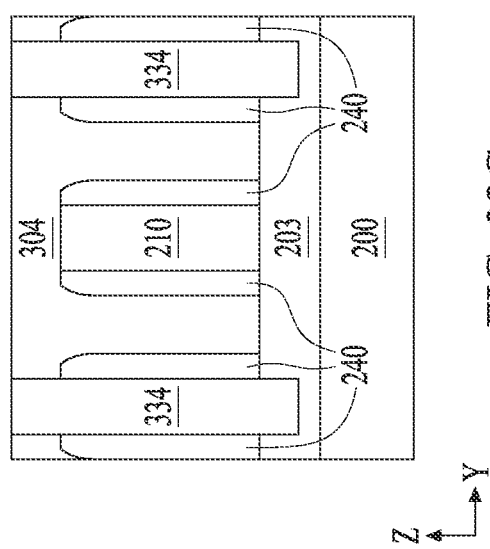
Figure 33A:
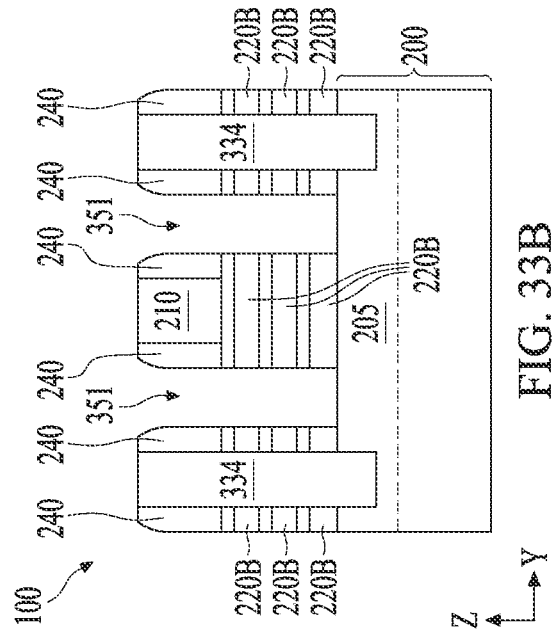
Figure 33C:
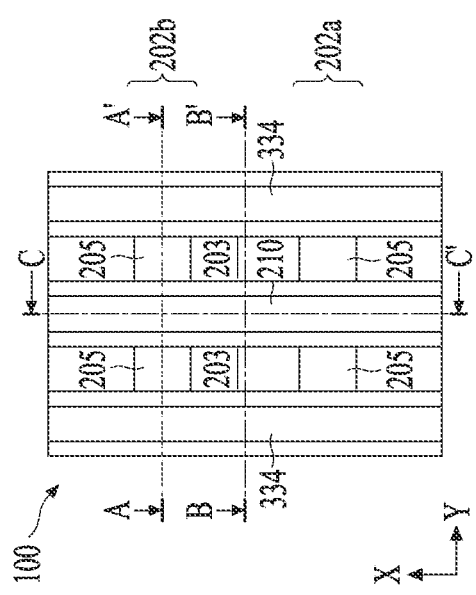
Figure 33B:
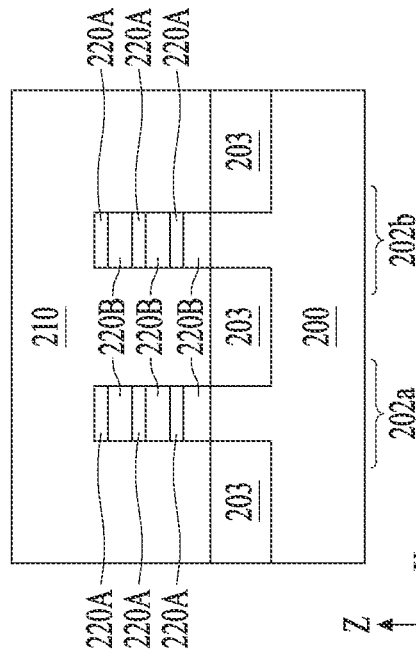
Figure 33D:
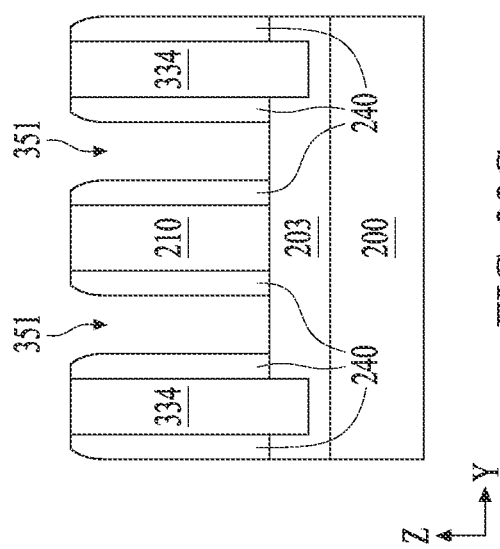
Figure 34A:
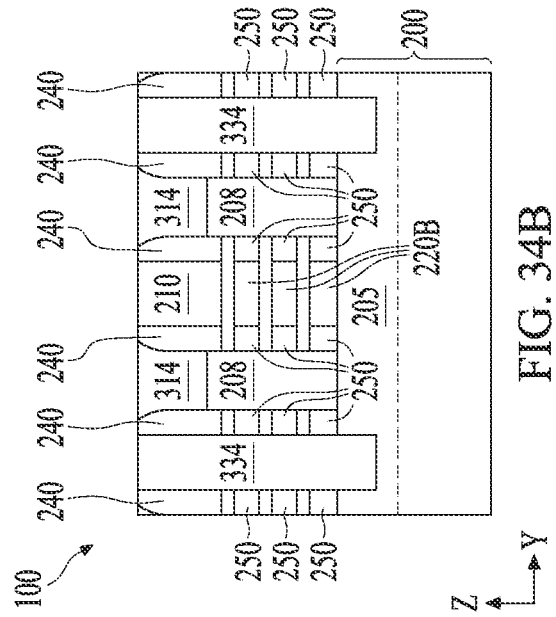
Figure 34B:
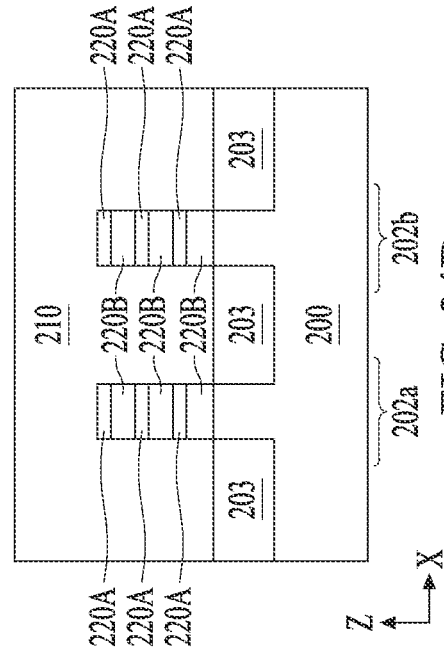
Figure 34C:
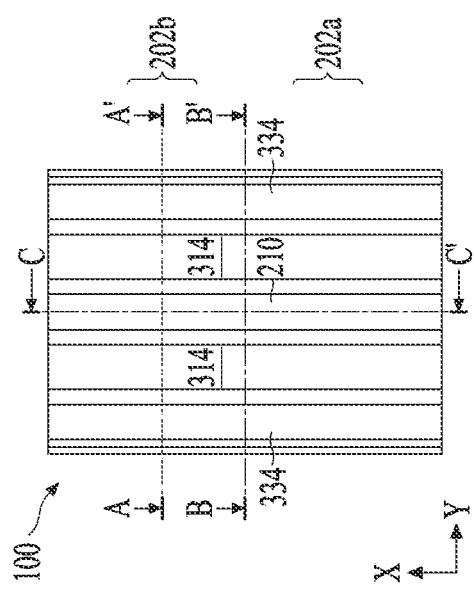
Figure 34D:
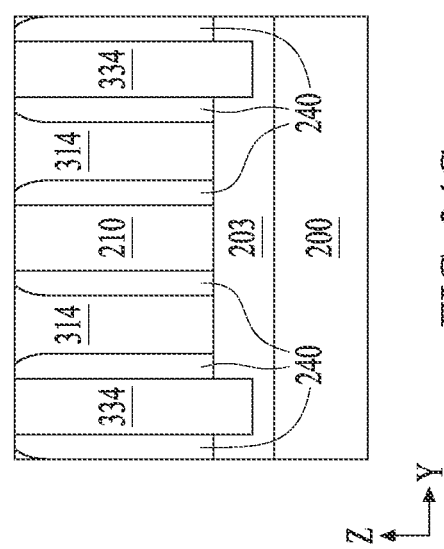
Figure 35A:
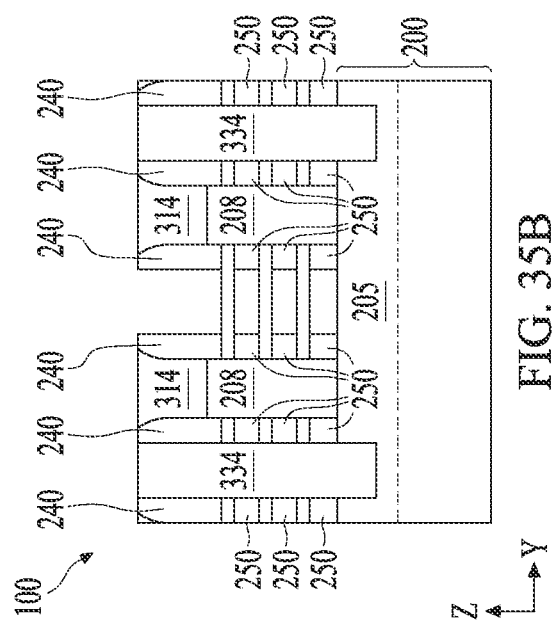
Figure 35B:
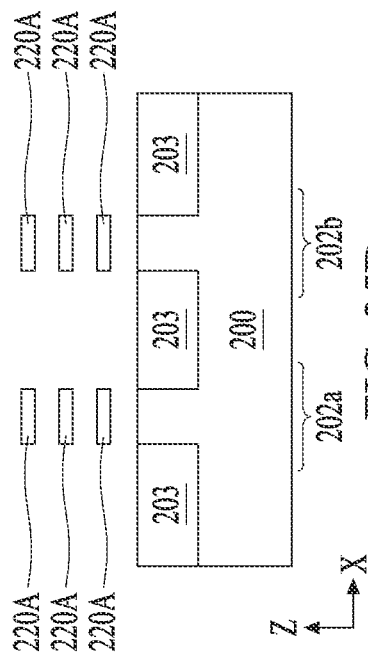
Figure 35C:
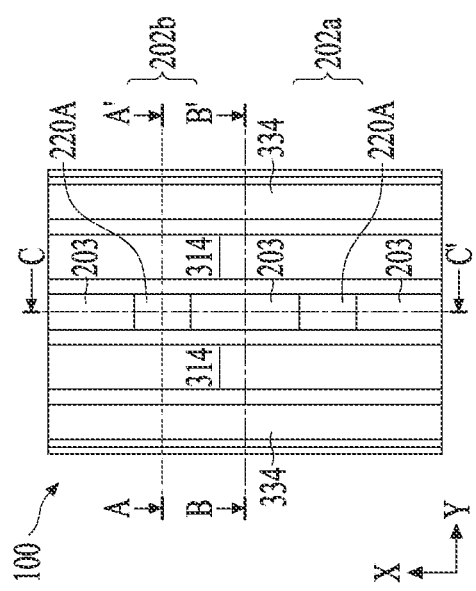
Figure 35D:
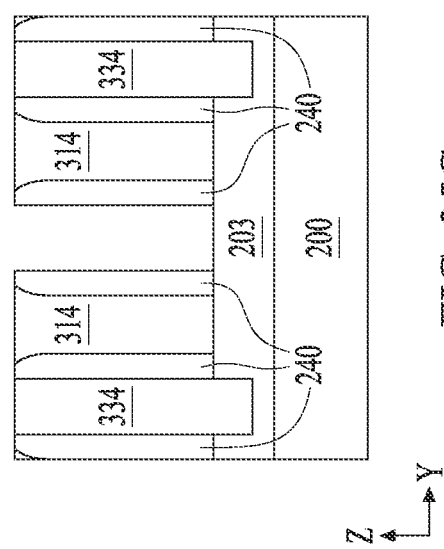
Figure 36A:
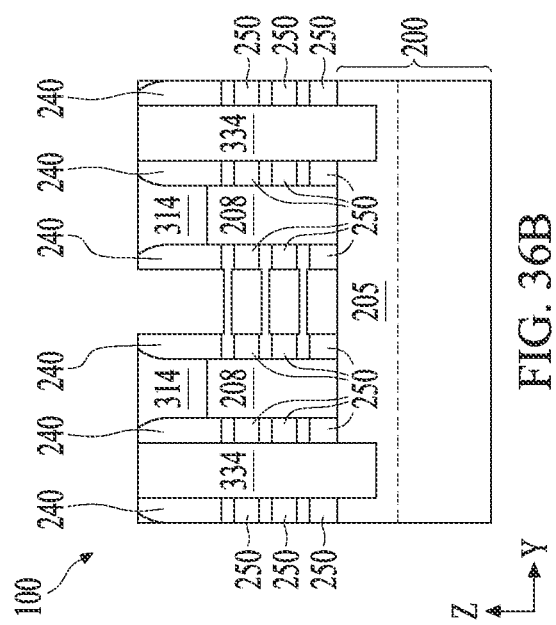
Figure 36B:
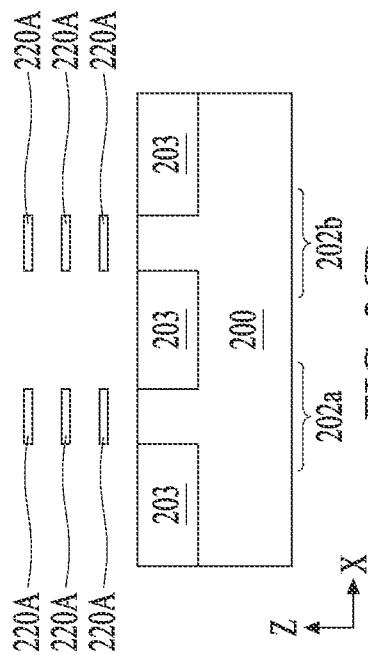
Figure 36C:
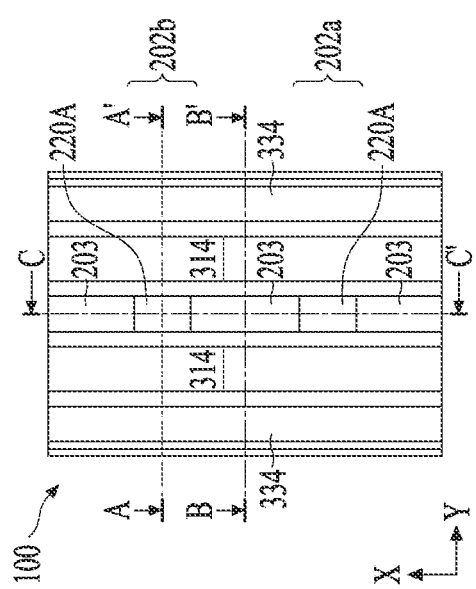
Figure 36D:
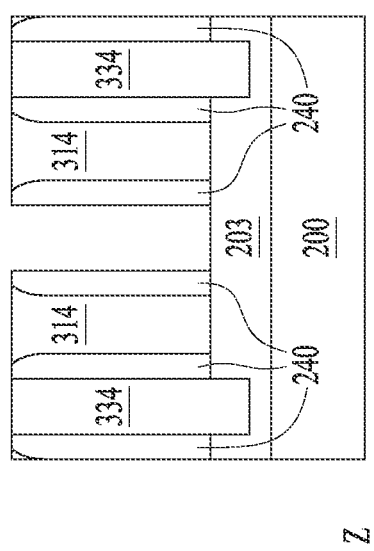
Figure 37B:
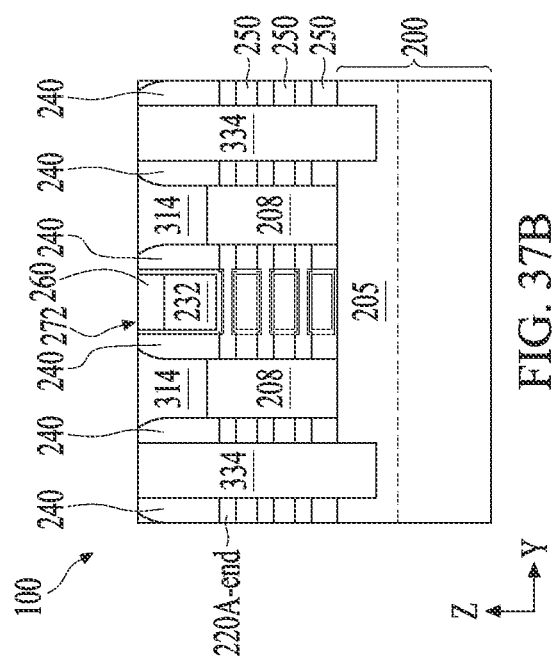
Figure 37D:
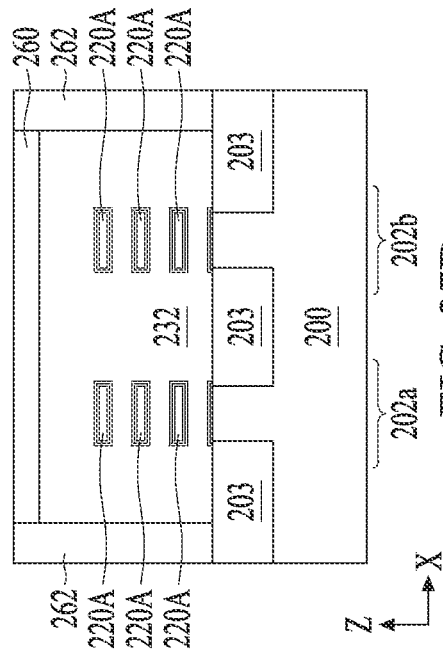
Figure 37A:
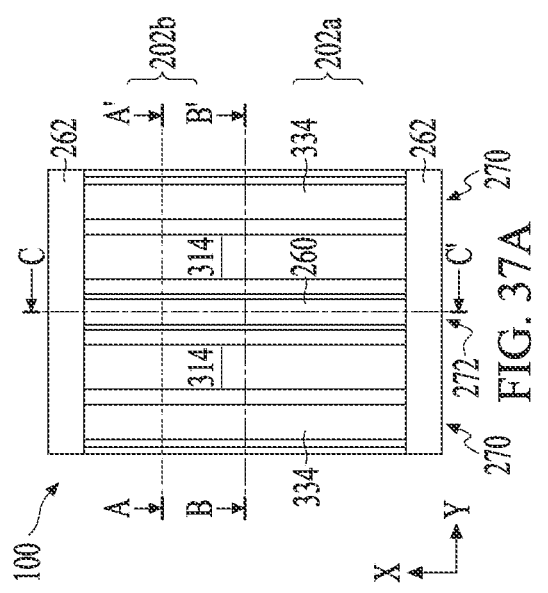
Figure 37C:
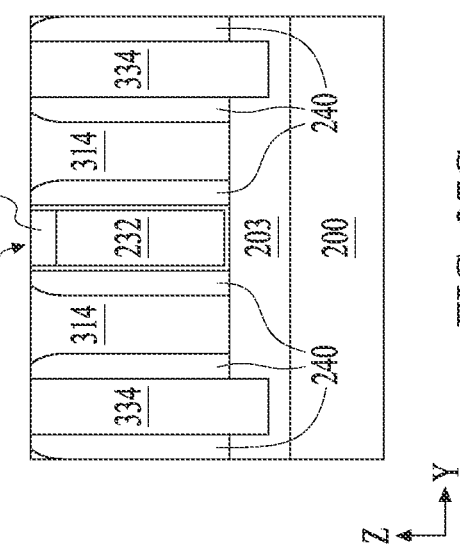
Figure 38B:
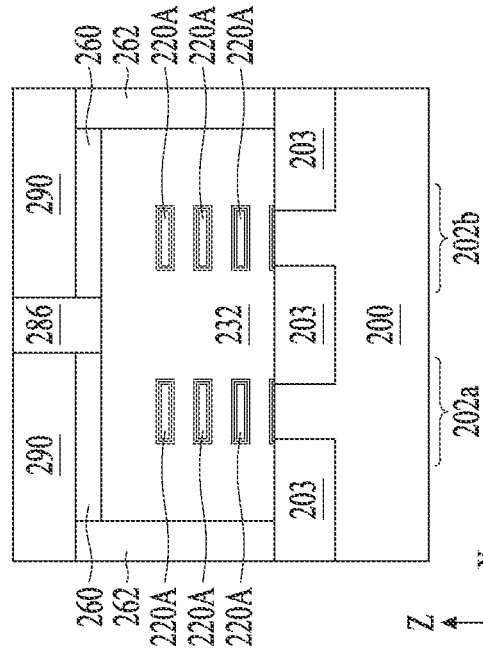
Figure 38D:
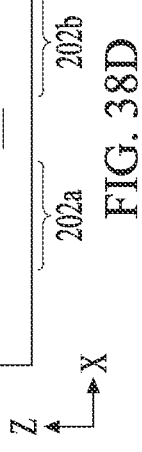
Figure 38A:
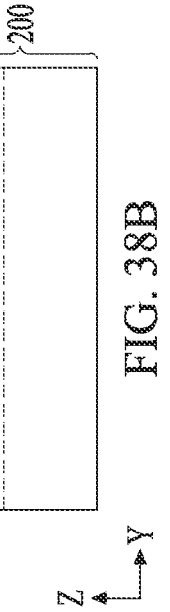
Figure 38C:
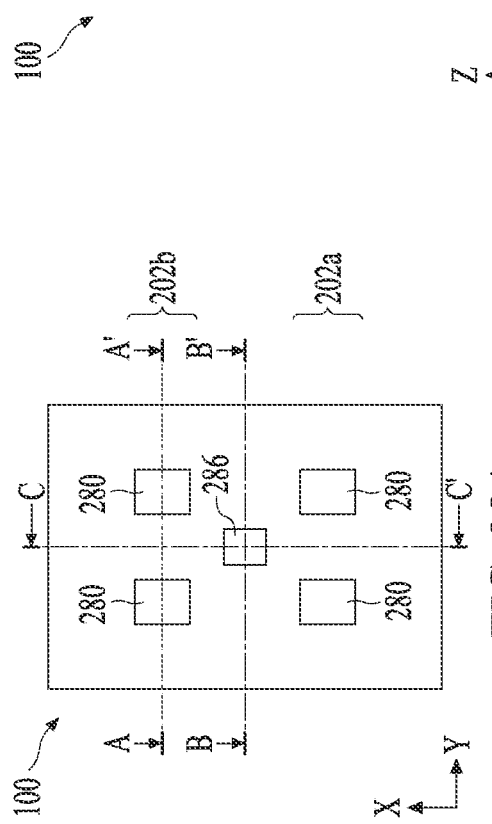

Referring to block 890 of FIG. 1B and FIGS. 10A-10D, the method 800 continues to forming epitaxial source/drain features 208 in the source/drain trenches 151. In some embodiments, a source/drain feature is a source electrode, and the other source/drain feature is a drain electrode. As illustrated in FIG. 10B, each of the semiconductor layers 220A connects two epitaxial source/drain features. A portion of the semiconductor layers 220A may constitute a portion of a transistor channel. Multiple processes including etching and growth processes may be employed to grow the epitaxial source/drain features 208. In the depicted embodiment, the epitaxial source/drain features 208 have top surfaces that extend higher than the top surface of the topmost semiconductor layer 220A. However, in other embodiments, the epitaxial source/drain features 208 may alternatively have top surfaces that are about even with the top surface of the topmost semiconductor layer 220A. In the depicted embodiment, the epitaxial source/drain features 208 occupy a lower portion of the trenches 151, leaving an upper portion of the trenches 151 open.

In some embodiments, the epitaxial source/drain features 208 may merge together, for example, along the X-direction, to provide a larger lateral width than an individual epitaxial feature. In the depicted embodiments, the epitaxial source/drain features 208 are not merged. The epitaxial source/drain features 208 may include any suitable semiconductor materials. For example, the epitaxial source/drain features 208 in an n-type GAA device may include Si, SiC, or combinations thereof; while the epitaxial source/drain features 208 in a p-type GAA device may include Si, SiGe, Ge, SiGeC, or combinations thereof. The source/drain features 208 may be doped in-situ or ex-situ. For example, the epitaxially grown Si source/drain features may be doped with carbon to form silicon:carbon (Si:C) source/drain features, phosphorous to form silicon:phosphor (Si:P) source/drain features, or both carbon and phosphorous to form silicon carbon phosphor (SiCP) source/drain features; and the epitaxially grown SiGe source/drain features may be doped with boron. One or more annealing processes may be performed to activate the dopants in the epitaxial source/drain features 208. The annealing processes may comprise rapid thermal annealing (RTA) and/or laser annealing processes.

The epitaxial source/drain features 208 directly interface with the sidewalls 171, which include sidewalls of the semiconductor layers 220A, of the inner spacers 250, and possibly of the top spacers 240 (depending on the height of the epitaxial source/drain features 208). During the epitaxial growth, semiconductor materials grow from the exposed top surface of the doped region 205 as well as from the exposed surface of the semiconductor layers 220A and do not grow on the surfaces of the inner spacers 250 and the top spacers 240. Therefore, it is desirable to minimize the surface area of the inner spacers 250 (and top spacers 240) on the sidewall surface 171. In other words, a smaller thickness of the inner spacer 250 (e.g. thickness 315) along the Z-direction, and a larger thickness of the semiconductor layer 200A (e.g. thickness 305) are favorable for the growth and the quality of the epitaxial source/drain features. The inventor of the present disclosure has discovered that a ratio $r_1$ (defined as the ratio of thickness 305 to thickness 315) higher than results in good crystalline quality in the epitaxial source/drain features 208. In some embodiment, the ratio $r_1$ is set to be in a range of 0.9 to 2.5. In some other embodiments, the ratio $r_1$ is set to be in a range of 1 to 2 for obtaining high crystalline quality in the epitaxial source/drain features 208.

Referring to block 900 of FIG. 1B and FIGS. 11A-11D, an interlayer dielectric (ILD) layer 214 is formed over the epitaxial source/drain features 208 in the remaining spaces of the trenches 151, as well as vertically over the isolation features 203. The ILD layer 214 may also be formed in between the adjacent gates 210 along the Y-direction, and in between the source/drain features 208 along the X-direction. The ILD layer 214 may include a dielectric material, such as a high-k material, a low-k material, or an extreme low-k material. For example, the ILD layer 214 may include $SiO_2$, SiOC, SiON, or combinations thereof. The ILD layer 214 may include a single layer or multiple layers, and may be formed by a suitable technique, such as CVD, ALD, and/or spin-on techniques. After forming the ILD layer 214, a CMP process may be performed to remove excessive ILD layer 214 and planarized the top surface of the ILD layer 214. Among other functions, the ILD layer 214 provides electrical isolation between the various components of the GAA device 100.

Referring to block 910 of FIG. 1B and FIGS. 12A-12D, the dummy gate structures 210 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 210. Then, the dummy gate structures 210 are selectively etched through the masking element. In some other embodiments, the top spacers 240 may be used as the masking element or a part thereof. For example, the dummy gate structures 210 may include polysilicon, the top spacers 240 and the inner spacers 250 may include dielectric materials, and the semiconductor layers 220A-center includes a semiconductor material. Therefore, an etch selectivity may be achieved by selecting appropriate etching chemicals, such that the dummy gate structures 210 may be removed without substantially affecting the other components of the device 100.

The removal of the dummy gate structures 210 creates trenches 153. The trenches 153 expose the top surfaces and the side surfaces of the stack (along the X direction). In other words, the center portions 220A-center and 220B-center are exposed at least on two side surfaces in the trenches 153. Additionally, the trenches 153 also expose the top surfaces of the isolation features 203. At this stage, the center portions 220A-center and 220B-center may have lateral widths that are substantially similar to that of the fins 130a and 130b. Accordingly, the center portions 220A-center may also each have the thickness 300, and the center portions 220B-center may each have the thickness 310.

Referring to block 910 of FIG. 1B and FIGS. 13A-13D, the remaining center portions 220B-center are also selectively removed through the trenches 153, for example using wet or dry etching process. The etching chemical is selected such that the center portions 220B-center has a sufficiently different etching rate as compared to the center portions 220A-center and the inner spacers 250. As a result, the center portions 220A-center and the inner spacers 250 are only slightly affected during the selective etching process. For example, after the etching process, the center-portions 220A-center each has a thickness 308. Thickness 308 is slightly smaller than thickness 300, for example, 1% to 10% smaller than thickness 300. In an embodiment, thickness 308 is substantially equal to thickness 305 of the end portions 220A-end. In other words, the semiconductor layers 220A has a substantially uniform thickness at this stage. Additionally, the selective etching process creates openings 157. The openings 157 each has a height 318 (or interchangeably referred to as thickness 318). Thickness 318 is slightly larger than thickness 310, for example, 1% to 10% larger than thickness 310. In an embodiment, thickness 318 is substantially equal to thickness 315 of the inner spacers 250. This selective etching process may include one or more etching steps.

As illustrated in FIGS. 13A-13D, in the present embodiment, the removal of the semiconductor layers 220B forms suspended semiconductor layers 220A-center and openings 157 in between the vertically adjacent layers, exposing the top and bottom surfaces of the center portions 220A-center. Each of the center portions 220A-center are now exposed circumferentially around the Y-direction. In addition, the portion of the doped regions 205 beneath the center portions 220A-center are also exposed in the openings 157. In some other embodiments however, the removal process only removes some but not all of the center portions 220B-center. As a result, some of the center portions 220A-center are exposed circumferentially around the Y-direction, while others are exposed only on the two side surfaces along the X-direction; and the doped regions 205 is not exposed.

As described above, it is desirable to increase the thickness of the semiconductor layers 220A (or more specifically, the end portions 220A-end) to improve the quality of the epitaxial source/drain features 208. On the other hand, a thicker semiconductor layer 220A in the channel region would reduce the available spacing between the semiconductor layers to form other layers, such as the high-k gate dielectric layers, the metal layers, etc. Thus, the semiconductor layers 220A are purposefully designed according to the present disclosure to have different thicknesses and/or different widths in different regions to address the above concerns. For example, the center portions 220A-center of the semiconductor layers 220A each has a smaller thickness to allow sufficient processing margins for subsequent depositions, while the end portions 220A-end each has a larger thickness to effectuate good epitaxial growth of the epitaxial source/drain features 208.

Referring to block 920 of FIG. 1B and FIGS. 14A-14D and, the center portions 220A-center of the semiconductor layers 220A are subject to a partial etching treatment (or "thinning treatment"). This treatment reduces the thickness of the center portions 220A-center. In other words, the center portions 220A-center of the semiconductor layers 220A are circumferentially trimmed. As described above, the center portions 220A-center and the end portions 220A-end have thickness 308 and thickness 305, respectively, prior to the partial etching treatment. Both thickness 308 and thickness 305 are slightly smaller (such as 1% to 10% smaller) than thickness 300. In other words, the semiconductor layers 220A have a substantially uniform thickness prior to the treatment process. After the treatment however, while the end portions 220A-end maintain thickness 305, the center portions 220A-center each has a thickness substantially smaller than thickness 308 (and thickness 305). For example, as illustrated in the FIGS. 14B and 14D, the center portions 220A-center now each has a thickness 320 that is substantially smaller than the end portions 220A-end (as described in more detail below). In some embodiments, both thicknesses 305 and 320 are within a range of about 3 nm to about 10 nm. If the thicknesses 305 and 320 are too smaller, such as smaller than 3 nm, the inevitable variations in the fabrication processes may result in unacceptable inconsistency among devices and ultimately negatively affect the process reliability. Conversely, if the thicknesses 305 and 320 are too large, such as larger than 10 nm, gate control of the entire channel region may not be reached, and resistance during the operation may increase. Although not shown in the figures, the center portions 220A-center may also have a width smaller than the end portions 220A-end along the X direction. In other words, the lateral width of the semiconductor layers 220A-center in FIG. 14A along the X-direction (width 360) may be smaller than the lateral width of the semiconductor layers 220A-center in FIG. 13A along the X-direction (width 350). In some embodiments, both the widths 350 and 360 are within the range of about 6 nm to about 60 nm. Similar to the variations in the thicknesses 305 and/or 320, if the width 350 and/or 360 depart from this range, either the device reliability or the gate control of the channel region may be negatively affected.

The partial etching treatment may use any suitable methods, for example, a conformal wet-etching process. In an embodiment, the wet-etching method implements an isotropic etching process with an acidic etching chemical. For example, the etching chemical may include de-ionized water, ozone ($O_3$), and hydrofluoric acid, and the de-ionized water and hydrofluoric acid have a molar ratio between about 1:50 and about 1:2000. In another embodiment, the wet-etching method implements an isotropic etching process with a basic etching chemical. For example, the etching chemical may include ammonia water. The duration of the treatment in which the center portions 220A are exposed to the etching chemical may be used to control the amount of the semiconductor materials removed from the center portions 220A-center, thereby controlling the thickness 320. Alternatively or additionally, the partial etching treatment may use a conformal oxidation method. For example, a circumferential surface of the center portions 220A-center may be subject to an oxidant, e.g. oxygen, to form a layer of oxides. The oxides are subsequently removed using any appropriate method, for example, by exposure to an acid. As a result, the center portions 220A-center has a reduced thickness as compared to before the treatment.

As described above, a smaller thickness 320 and a larger thickness 305 is desirable. In an embodiment, the ratio $r_2$, defined by thickness 305 over thickness 320, may be between about 1.1 to about 3. In another embodiment, the ratio r 2 may be between about 1.2 to about 2. Furthermore, in an embodiment, the difference A between thickness 305 and thickness 320 is larger than about 0.5 nm to about 3 nm. If the ratio r 2 is too small, such as smaller than about 1.1, or the difference A is too small, such as smaller than about 0.5 nm, the benefit for increasing the surface area for epitaxial growth margin may not be discernable. On the other hand, if the ratio r 2 is too large, such as larger than about 3, the improvement in the epitaxial growth margin may have been saturated while processing challenges may increase.

Referring to FIGS. 15A-15D, a dielectric layer 223 is formed over the center portions 220A-center of the semiconductor layers 220A. This dielectric layer 223 may be an interfacial layer. Any suitable methods may be used to form the dielectric layer 223, such as ALD, CVD, or other deposition methods. Alternatively, in the depicted embodiments, the dielectric layer 223 may also be formed by an oxidation process, such as thermal oxidation or chemical oxidation (as seen in FIGS. 15A-15D). In this instance, no interfacial layer 223 is formed on the sidewalls of the top spacers 240 or the inner spacers 250. In many embodiments, the interfacial layer 223 improves the adhesion between the semiconductor substrate and the subsequently formed gate dielectric layers. In some embodiments, the interfacial layers 223 are omitted.

Referring to blocks 930-940 of FIG. 1B, FIGS. 16A-16D, and FIGS. 17A-17D, a gate structure is formed. The gate structure includes a gate dielectric layer and a gate electrode over the gate dielectric layer. For example, the gate structure may include a polysilicon gate electrode over a SiON gate dielectric layer. For another example, the gate structure may include a metal gate electrode over a high-k dielectric layer. In some instances, a refractory metal layer may interpose between the metal gate electrode (such as an aluminum gate electrode) and the high-k dielectric layer. For yet another example, the gate structure may include silicide. In the depicted embodiment, the gate structures each includes a high-k gate dielectric layer 228 and a gate electrode that comprises one or more metal layers 230-232. The high-k gate dielectric layers 228 are formed between the metal layers 230-232 and the nanochannels of the semiconductor layers 220A (e.g. the center portions 220A-center).

In some embodiments, the high-k gate dielectric layers 228 are formed conformally on the device 100 (see FIGS. 16A-16D). This high-k gate dielectric layers 228 at least partially fill the trenches 153. In some embodiments, the high-k gate dielectric layers 228 may be formed around the exposed surfaces of each of the semiconductor layers 220A, such that they wrap around the center portions 220A-center of each of the semiconductor layers 220A in 360 degrees. The high-k gate dielectric layers 228 also directly contact the vertical sidewalls of the interfacial layer 223, or in its absence, directly contact the vertical sidewalls of the two end portions 220A-end of each of the semiconductor layers 220A. Additionally, the high-k gate dielectric layers 228 also directly contact vertical sidewalls of the inner spacers 250 and of the top spacers 240. The high-k gate dielectric layers 228 contain a dielectric material having a dielectric constant greater than a dielectric constant of $SiO_2$, which is approximately 3.9. For example, the high-k gate dielectric layers 228 may include hafnium oxide ($HfO_2$), which has a dielectric constant in a range from about 18 to about 40. As various other examples, the high-k gate dielectric layers 228 may include $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HMO, HMO, SrTiO, or combinations thereof. The formation of the high-k gate dielectric layers 228 may be by any suitable processes, such as CVD, PVD, ALD, or combinations thereof.

Referring to block 940 of FIG. 1B and FIGS. 17A-17D, the metal layers 230-232 are formed over the high-k gate dielectric layers 228 and fill the remaining spaces of the trenches 153. The metal layers 230-232 may include any suitable materials, such as titanium nitride (TiN), tantalum nitride (TaN), titanium aluminide (TiAl), titanium aluminum nitride (TiAlN), tantalum aluminide (TaAl), tantalum aluminum nitride (TaAlN), tantalum aluminum carbide (TaAlC), tantalum carbonitride (TaCN), aluminum (Al), tungsten (W), copper (Cu), cobalt (Co), nickel (Ni), platinum (Pt), or combinations thereof. In some embodiments, a CMP is performed to expose a top surface of the ILD 214. The dielectric layers 228 and the metal layers 230 collectively form the high-k metal gates (HKMG) 270 and the dielectric layers 228 and the metal layers 232 collectively form the high-k metal gates (HKMG) 272. The HKMG 270-272 each engages multiple nanochannels, e.g. multiple layers within the center portions 220A-center.

In some embodiments, a gate top hard mask layer 260 may optionally be formed over the HKMG 270-272. For example, referring to FIGS. 18A-18D, the metal layers 230-232 may optionally be recessed, such that a top surface of the metal layer 230-232 extends below a top surface of the ILD 214. Subsequently, as illustrated in FIGS. 19A-19D, gate top hard mask layer 260 is formed over the GAA device 100 such that it covers the HKMG 270-272 (specifically, the metal layers 230-232), the ILD layers 214, and fills the space created by the recess process. A CMP may be conducted to planarize the top surfaces. In some embodiments, as illustrated in FIGS. 20A-20D, the CMP exposes the top surfaces of the ILD layers 214, the top surfaces of the top spacers 240, and the top surface of the gate top hard mask layer 260. The gate top hard mask layers 260 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. The gate top hard mask layer 260 protects the HKMG 272 in the subsequent etching processes to form the source/drain contact features, and also insulates the HKMG 272. However, in some other embodiments (not shown), the recess of the metal layers 230-232 and/or the formation of the gate top hard mask layers 260 is omitted.

Referring to block 950 of FIG. 1C and FIGS. 21A-21D, a mask layer 282 (e.g. a photoresist layer) is formed over the top surface of the device 100. The mask layer 282 may cover the main body (or the center region) of the device 100 but not the two end regions 283 (along the X-direction) of the device 100.

Referring to block 960 of FIGS. 1C and 22A-22D, an end-cut process is subsequently conducted. The end-cut process forms end-cut trenches 155 (see FIGS. 22A-22D), which split the HKMG 270-272 along the X direction into individual gates. The individual gates may extend over an n-type region only, over a p-type region only, or over both an n-type region and a p-type region. The end-cut process may include any suitable lithography and etching processes such that the end regions 283 are etched down to expose the isolation structure 203.

Referring to block 970 of FIG. 1C and FIGS. 23A-23D, a dielectric material is deposited into the end-cut trenches 155 to form the gate end dielectric layer 262, which extends from a top surface of the isolation features 203 and fully covers an end of the gates, such as the HKMG 270-272. The gate end dielectric layer 262 may include a nitride-based dielectric material (e.g., $Si_3N_4$), a metal oxide, $SiO_2$, or combinations thereof. As described later, a subsequent step removes the top spacers 240 and the inner spacers 250 without substantially affecting the gate end dielectric layer 262. Therefore, there needs to be sufficient etching selectivity between the gate end dielectric layer 262 and the spacer layers (240 and 250). For example, the etching rate for the top spacers 240 and the inner spacers 250 in the etching chemical may be substantially faster than the etching rate for the gate end dielectric layer 262 in the same solution, e.g. more than about 5 to 50 times faster. This difference in etching rate is a result of the different characteristics of the materials in these different layers, which may also be manifested in their different dielectric constants. In many embodiments, the gate end dielectric material may have a dielectric constant higher than both that of the top spacers 240 and that of the inner spacers 250. For example, the gate end dielectric layer 262 may include a dielectric material with a dielectric constant larger than about 6.9 to about 7. For example, the gate end dielectric layer 262 may include nitride. The nitride may have a dielectric constant larger than about 7.8 to about 8.0. On the other hand, the top spacers 240 and/or the inner spacers 250 may include oxide-based dielectric materials. For example, the top spacers 240 and/or the inner spacers 250 may include oxides with a dielectric constant in the range of about 3.9 to about 5.0. For another example, the top spacers 240 and/or the inner spacers 250 may include doped oxides, such as nitrogen-doped oxides and/or carbon-doped oxides. The nitrogen-doped oxide may have a dielectric constant between about 4 and about 5. The carbon-doped oxide may have a dielectric constant between about 3 and about 4. In some embodiments, the gate end dielectric layer 262 may include a single layer. In some other embodiments, the gate end dielectric layer 262 may include multiple layers, such as a nitride layer and an oxide layer.

Referring to block 980 of FIG. 1C and FIGS. 24A-24D, a mask layer 284 (e.g. a photoresist layer) is formed over the GAA device 100. In an embodiment, the mask layer 284 covers one or more HKMG 272 but not covering one or more HKMG 270. Subsequently, referring to block 990 of FIG. 1C and FIGS. 25A-25D, the exposed HKMG 270 are removed via any suitable processes to form gate trenches 157. As a result, the doped regions 205 as well as the isolation features 203 beneath the HKMG 270 are exposed in the gate trenches 157. The etching process may be a wet etching or a dry etching process, using the mask layer 284 as the masking elements. In the depicted embodiment, the etching process not only removes the exposed HKMG 270, but also removes the gate dielectric layer 228 and partially recesses the doped region 205 of the substrate 200. However, in other embodiments, the removal of the gate dielectric layer 228 and/or the recess of the doped region 205 may be omitted. Alternatively or additionally, the sidewalls of the top spacers 240 may be used as masking elements.

As illustrated in block 1000 of FIG. 1C and FIGS. 26A-26D, the gate trenches 157 are filled with one or more dielectric materials to form the dielectric based gates 234. At this stage, some of the end portions 220A-end are located between and connect the dielectric based gates 234 and the epitaxial source/drain features 208. These end portions 220A-end may also be referred to as "wing portions" of the semiconductor layers 220A. The dielectric materials may include $SiO_2$, SiOC, SiON, SiOCN, carbon-doped oxide, nitrogen-doped oxide, carbon-doped and nitrogen-doped oxide, dielectric metal oxides such as $HfO_2$, $Ta_2O_5$, $TiO_2$, $ZrO_2$, $Al_2O_3$, $Y_2O_3$, lanthanum-(La—) doped oxide, oxide doped with multiple metals, or combinations thereof. The dielectric based gates 234 may include a single layer or multiple layers. The formation processes may use any suitable processes, such as ALD, CVD, PVD, PEALD, PECVD, or combinations thereof. A CMP process may be performed to remove excessive dielectric materials and provide a top surface that is substantially coplanar with the ILD layer 214, the top spacers 240, and the gate end dielectric layers 262.

Referring to block 1010 of FIG. 1C and FIGS. 27A-27D, a gate top dielectric layer 290 is formed over the GAA device 100. The gate top dielectric layer 290 may be formed by any suitable processes, such as CVD, PECVD, flowable CVD (FCVD), or combinations thereof. The gate top dielectric layer 290 covers top surfaces of the dielectric based gates 234, the ILD 214, the top spacers 240, the HKMG 272, and the gate top hard mask layer 260, if present. The gate top dielectric layer 290 may include a dielectric material, such as $SiO_2$, SiOC, SiON, SiOCN, nitride-based dielectric, metal oxide dielectric, $HfO_2$, $Ta_2O_5$, $TiO_2$, $ZrO_2$, $Al_2O_3$, $Y_2O_3$, or combinations thereof. The gate top dielectric layer 290 may have a thickness between about 3 nm and about 30 nm. In some embodiments, the gate top dielectric layer 290 protect the HKMG 272 in the subsequent etching processes to form the source/drain contact features, and also insulate the HKMG 272.

Referring to block 1020 of FIG. 1C and FIGS. 28A-28D, a portion of the gate top dielectric layer 290 and ILD 214 are removed to form contact holes 278 over the epitaxial source/drain features 208. Any appropriate methods may be used to form the contact holes 278, such as multiple lithography and etching steps. In an embodiment, a self-aligned contact formation process may be utilized. For example, the ILD 214 may include a dielectric material that has an etching rate substantially faster than that of the top spacers 240 and that of the gate top hard mask layer 260. Therefore, the top spacers 240 and the gate top hard mask layer 260 are not substantially affected when the ILD 214 is etched away to form the contact holes 278. As the top spacers 240 and the gate top hard mask layer 260 protect the HKMG 272 from the etching chemical, the integrity of the HKMG 272 are preserved. The contact holes 278 expose the top surfaces of the epitaxial source/drain features 208 for subsequent contact layer formation. Additionally, a portion of the gate top dielectric layer 290 and the gate top hard mask layer 260 (if present) are also removed to form via holes 285 over the metal layers 232 of the HKMG 272. The via holes 285 expose the metal layers 232 for subsequent via feature formation. Any appropriate methods may be used to form the via holes 285, and may include multiple lithography and etching steps.

Referring to block 1030 of FIG. 1C and FIGS. 29A-29D, contact features 280 are formed within the contact holes 278. Accordingly, the contact features 280 are embedded within the gate top dielectric layer 290 and ILD 214, and electrically connect the epitaxial source/drain features 208 to external conductive features (not shown). Additionally, via features 286 are also formed in the via holes 285. Accordingly, the via features 286 are embedded within the gate top dielectric layer 290 (and within the gate top hard mask layer 260, if present) and electrically connect the HKMG 272 to external conductive features (not shown). The contact features 280 and the via features 286 may each include Ti, TiN, TaN, Co, Ru, Pt, W, Al, Cu, or combinations thereof, respectively. Any suitable methods may be used to form the contact features 280 and the via features 286. In some embodiments, additional features are formed in between the source/drain features 208 and the contacts 280, such as self-aligned silicide features 288. A CMP process may be performed to planarize the top surface of the GAA device 100.

As discussed above, there needs to be a good etching selectivity between the top spacers 240 and the inner spacers 250 in order to selectively remove the inner spacer material from the source/drain trench while leaving the top spacer intact (block 870 of the FIG. 1A). Therefore, dielectric constants for the two spacers need to be different. Whether the top spacer or the inner spacer should use a material with a lower dielectric constant may be a design choice. For example, the design choice may be made based on a comparison between the relative importance of the capacitance values of different device regions. The lower-k dielectric material may be assigned to increase the capacitance (or reduce the electronic coupling) of a particular region of the device according to the design needs.

More specifically, the top spacer 240 may be considered to be the dielectric medium of a capacitor between a pair of vertically aligned conductive plates, i.e., the sidewall of the contact 280 and the sidewall of the HKMG 272. Similarly, the inner spacer 250 may be considered to be the dielectric medium of another capacitor between another pair of vertically aligned conductive plates, i.e. the sidewall of the source/drain feature 208 and the sidewall of the HKMG 272. The capacitance is proportional to the dielectric constant of the dielectric medium, according to the following equation:

$$C = \varepsilon \frac{A}{d} = k\varepsilon_0 \frac{A}{d}$$

wherein C is the capacitance of the capacitor, c is the permittivity of the dielectric medium, $\varepsilon_0$ is the permittivity of vacuum, A is the area of the capacitor, d is the separation distance of the capacitor, and k is the dielectric constant of the dielectric medium. Therefore, a smaller dielectric constant leads to a smaller capacitance. If, according to the design needs, it is more important to have a higher capacitance in the contact—metal gate region than in the source/drain—metal gate region, the designer may assign the material with the lower k to the top spacer 240 rather than the inner spacer 250. On the other hand, if it is more important to have a higher capacitance in the source/drain-metal gate region, the designer may assign the material with the lower k to the inner spacer 250 rather than the top spacer 240.

Referring to block 1040 of FIG. 1C, additional layers and/or features may also be formed above and/or within the gate top dielectric layer 290 to complete the fabrication of the GAA device 100.

The above process flow describes one embodiment of the present invention. In this embodiment, the dielectric based gates 234 are formed after the formation HKMG 270-272. However, the invention is not so restricted, and other embodiments are also contemplated without departing from the spirit of the invention. For example, FIGS. 30A-38A, 30B-38B, 30C-38C, and 30D-38D illustrate one alternative embodiment. Here, rather than forming the dielectric based gates 234 by removing the HKMG 270 and filling the gate trenches, they may alternatively be formed prior to the formation of the HKMG 270-272. In one such implementation, after the top spacers 240 are formed (e.g. as illustrated in FIGS. 5A-5D), an ILD 304 may be formed over the GAA device 100. A mask layer 384 may be formed over the ILD 304 to cover the entire area except the region in which the dielectric based gates are to be formed (see FIGS. 30A-30D). An etching process may be used to remove the exposed portions of the ILD 304, as well as the dummy gate structures 210 beneath the ILD 304. The etching process may also remove a portion of the doped regions 205 under the dummy gate structures 210. This etching process forms dielectric base gate trenches 357, which are similar to those trenches 157 illustrated in FIGS. 25A-25D. The mask layer 384 may then be removed (see FIGS. 31A-31D). Once the dielectric base gate trenches 357 are formed, a dielectric material, similar to those described above for dielectric base gates 234, are used to fill in the trenches 357 to form the dielectric based gates 334 (see FIGS. 32A-32D). The method then proceeds to conduct a CMP and etch a portion of the stack to form the source/drain trenches 351, similar to those trenches 151 illustrated in the FIGS. 6A-6D (see FIGS. 33A-33D). Subsequent processes may proceed in ways similar to those illustrated in FIGS. 7A-23A, 7B-23B, 7C-23C, and 7D-23D (see FIGS. 34A-37A, 34B-37B, 34C-37C, and 34D-37D). The final structure (see FIGS. 38A-38D) may be similar to that of FIGS. 29A-29D.

Additional details for this alternative embodiment may be found in related patents, such as U.S. Pat. No. 9,613,953, entitled "Semiconductor device, semiconductor device layout, and method of manufacturing semiconductor device" by Jhon Jhy Liaw, U.S. Pat. No. 9,805,985, entitled "Method of manufacturing semiconductor device and semiconductor device" by Jhon Jhy Liaw, and U.S. Pat. No. 9,793,273, entitled "Fin-based semiconductor device including a metal gate diffusion break structure with a conformal dielectric layer" by Jhon Jhy Liaw. These patents are herein incorporated in their entities for reference.

Though not intended to be limiting, embodiments of the present disclosure offer benefits for semiconductor processing and semiconductor devices. For example, the disclosed method allows larger process margins for forming gate dielectric layers and metal layers within the limited spacing between semiconductor channel layers of a GAA device than other technologies, thereby eliminating or reducing voids and/or other defects in those layers. For a specific example, the nanochannels of the GAA devices according to the present disclosure are purposefully thinned as compared to the end regions of the semiconductor layers adjacent the nanochannels. This process enlarges the spacing available for material depositions, thereby improving the various aspects of the GAA devices. Additionally, the present method allows the semiconductor layers to include thicker end portions on which epitaxial source/drain features grow. As a result, the epitaxial source/drain features are grown on side surfaces that include larger area of semiconductor materials, rather than dielectric materials. This improves the qualities of the epitaxial source/drain features, and eventually improves the performance and reliability of the GAA device. Furthermore, this present method also provides versatility allowing the designers to selectively optimize the capacitances of different regions of the GAA device according to design needs. As such, the present disclosure provides methods that improve the performance, functionality, and/or reliability of GAA devices.

In an exemplary aspect, the present disclosure is directed to an integrated circuit (IC) device. The IC device comprises a semiconductor substrate having a top surface; a first source/drain feature and a second source/drain feature over the semiconductor substrate; a first semiconductor layer extending in parallel with the top surface and connecting the first source/drain feature and the second source/drain feature, the first semiconductor layer having a center portion and two end portions, each of the two end portions connecting the center portion and one of the first and the second source/drain features; a first spacer over the two end portions of the first semiconductor layer; a second spacer vertically between the two end portions of the first semiconductor layer and the top surface; and a gate electrode wrapping around and engaging the center portion of the first semiconductor layer. The center portion of the first semiconductor layer has a first thickness, the two end portions of the first semiconductor layer each has a second thickness, and the first thickness is smaller than the second thickness.

In an embodiment, the IC device further comprises a stack of semiconductor layers over the semiconductor substrate. The first semiconductor layer is a topmost layer of the stack of semiconductor layers; and each of the stack of semiconductor layers has a center portion vertically aligned with the center portion of the first semiconductor layer and two end portions vertically aligned with the two end portions of the first semiconductor layer. In an embodiment, the center portion of each of the stack of semiconductor layers has a thickness about equal to the first thickness, and the two end portions of each of the stack of semiconductor layers have a thickness about equal to the second thickness.

In an embodiment, the IC device further comprises an isolation feature over the semiconductor substrate; and a gate end dielectric layer extending from a top surface of the isolation feature and covering an end of the gate electrode. The first spacer includes a first dielectric material with a first dielectric constant, the second spacer includes a second dielectric material with a second dielectric constant, the gate end dielectric layer includes a third dielectric material with a third dielectric constant. The third dielectric constant is higher than the first and the second dielectric constants.

In an embodiment, the semiconductor substrate includes a p-type region and an n-type region. The gate electrode extends across the p-type region and the n-type region.

In an embodiment, the IC device further comprises a dummy gate electrode disposed on an opposite side of the first source/drain feature from the gate electrode, the dummy gate electrode extending in parallel to the gate electrode. A bottom surface of the dummy gate electrode extends below a bottom surface of the gate electrode. The first semiconductor layer includes a wing portion connecting the first source/drain feature and the dummy gate electrode, and the wing portion of the first semiconductor layer has a thickness about equal to the second thickness.

In an embodiment, a ratio of the second thickness over the first thickness is between 1.1 and 3. In an embodiment, a difference between the second thickness and the first thickness is at least 0.5 nm. In an embodiment, the first and the second thickness is each within a range of about 3 nm to about 10 nm. In an embodiment, the first semiconductor layer has a lateral width within a range of about 6 nm to about 60 nm.

In an embodiment, a ratio of the second thickness over the first thickness is between 1.2 and 2.

In another exemplary aspect, the present disclosure is directed to an integrated circuit (IC) device. The IC device includes a semiconductor substrate having a top surface; a first source/drain feature and a second source/drain feature over the semiconductor substrate; semiconductor layers connecting the first source/drain feature and the second source/drain feature, the semiconductor layers stacked over each other along a first direction normal to the top surface. Each of the semiconductor layers has a center portion and two end portions, each of the two end portions connecting the center portion and one of the first and the second source/drain features. The IC device further includes a gate electrode engaging the center portion of each of the semiconductor layers; a first spacer over the two end portions of a topmost semiconductor layer of the semiconductor layers; a second spacer between vertically adjacent end portions of the semiconductor layers; and a gate end dielectric layer contacting two ends of each of the semiconductor layers. The center portion of each of the semiconductor layers has a first thickness, the two end portions of each of the semiconductor layers each has a second thickness, and the first thickness is smaller than the second thickness. The gate electrode extends across a p-type doped region and an n-type doped region.

In an embodiment, the first spacer includes a first dielectric material with a first dielectric constant; the second spacer includes a second dielectric material with a second dielectric constant; and the gate end dielectric layer includes a third dielectric material with a third dielectric constant, the third dielectric constant being larger than the first and the second dielectric constants.

In an embodiment, the first spacer includes a dielectric material selected from $SiO_2$, SiON, SiOC, SiOCN, airgap, or combinations thereof; the second spacer includes a dielectric material selected from $SiO_2$, $Si_3N_4$, carbon doped oxide, nitrogen doped oxide, porous oxide, or combinations thereof; and the gate end dielectric layer includes a dielectric material selected from $Si_3N_4$, a metal oxide, $SiO_2$, or combinations thereof.

In yet another exemplary aspect, the present disclosure is directed to a method. The method comprises receiving a structure of a semiconductor device. The structure includes a semiconductor substrate; a stack of first semiconductor layers and second semiconductor layers over the semiconductor substrate; a dummy gate structure over the stack; a first spacer on sidewalls of the dummy gate structure and over the stack; and source/drain trenches next to the stack and exposing the first and the second semiconductor layers. The first semiconductor layers and the second semiconductor layers have different material compositions and alternate with one another within the stack. The dummy gate structure wraps around top and side surfaces of the stack. The method further comprises removing a first portion of the first semiconductor layers exposed in the source/drain trenches under the first spacer to form first gaps; forming a second spacer in the first gaps; epitaxially growing source/drain features in the source/drain trenches; forming an interlayer dielectric (ILD) over the source/drain features; removing the dummy gate structure; after the dummy gate structure has been removed, removing a second portion of the first semiconductor layers; after removing the second portion of the first semiconductor layers, circumferentially trimming a center portion of the second semiconductor layers; after trimming the center portion of the second semiconductor layers, forming a gate dielectric layer on the trimmed center portion of the second semiconductor layers; and after depositing the gate dielectric layer, forming a gate electrode layer over the gate dielectric layer.

In an embodiment, the removing of the first portion of the second semiconductor layers renders a center portion of each of the second semiconductor layers to have a first thickness, and an end portion of the each of the second semiconductor layers to have a second thickness, and the first thickness is smaller than the second thickness. In an embodiment, the removing of the first portion of the second semiconductor layers renders a ratio of the second thickness over the first thickness being within a range of 1.2 to 2. In an embodiment, the removing of the first portion of the second semiconductor layers renders the second thickness being larger than the first thickness by more than 0.5 nm.

In an embodiment, the removing the first portion of the second semiconductor layers includes removing with a first solution, the first solution includes de-ionized water, ozone, and hydrofluoric acid, and a molar ratio of the de-ionized water to the hydrofluoric acid is within a range of 1:50 to 1:2000.

In an embodiment, the removing the first portion of the second semiconductor layers includes removing with a second solution, and the second solution includes ammonia water.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure, comprising:
   a base fin arising from a substrate;

a first source/drain feature and a second source/drain feature disposed over the base fin;
a plurality of nanostructures extending between and in contact with the first source/drain feature and the second source/drain feature along a direction;
a metal gate structure wrapping around each of the plurality of nanostructures; and
a first dielectric gate structure and a second dielectric gate structure disposed over the base fin,
wherein the first source/drain feature, the metal gate structure and the second source/drain feature are disposed between the first dielectric gate structure and the second dielectric gate structure along the direction,
wherein, along the direction, the first dielectric gate structure is spaced apart from the first source/drain feature by a stack of semiconductor layers interleaved by a stack of inner spacer features.

2. The device structure of claim 1, wherein the base fin comprises a doped well region.

3. The device structure of claim 1, wherein the first dielectric gate structure and the second dielectric gate structure comprise silicon oxide, silicon oxycarbide, silicon oxynitride, silicon oxycarbonitride, carbon-doped oxide, nitrogen-doped oxide, carbon-doped and nitrogen-doped oxide, hafnium oxide, tantalum oxide, titanium oxide, zirconium oxide, aluminum oxide, yttrium oxide, lanthanum-doped oxide, or combinations thereof.

4. The device structure of claim 1, wherein the metal gate structure comprise titanium nitride, tantalum nitride, titanium aluminide, titanium aluminum nitride, tantalum aluminide, tantalum aluminum nitride, tantalum aluminum carbide, tantalum carbonitride, aluminum, tungsten, copper, cobalt, nickel, platinum, or combinations thereof.

5. The device structure of claim 1, further comprising:
a silicide feature disposed on the first source/drain feature; and
a source/drain contact over the silicide feature.

6. The device structure of claim 5, wherein, along the direction, the first dielectric gate structure is spaced apart from the source/drain contact by a gate spacer.

7. The device structure of claim 1, wherein the stack of semiconductor layers comprises silicon or silicon germanium.

8. The device structure of claim 1, wherein each of the first dielectric gate structure and the second dielectric gate structure partially extends into the base fin such that a bottom surface of the first dielectric gate structure or the second dielectric gate structure is lower than a bottom surface of the metal gate structure.

9. The device structure of claim 1, wherein a sidewall of the first dielectric gate structure is in contact with the stack of semiconductor layers and the stack of inner spacer features.

10. A semiconductor structure, comprising:
a base fin arising from a substrate and extending lengthwise along a direction;
a plurality of nanostructures disposed over the base fin;
a metal gate structure wrapping around each of the plurality of nanostructures;
a dielectric gate structure disposed over and partially extending into the base fin; and
a source/drain feature disposed between the metal gate structure and the dielectric gate structure along the direction,
wherein the dielectric gate structure is spaced apart from the source/drain feature by a stack of semiconductor layers interleaved by a stack of inner spacer features.

11. The semiconductor structure of claim 10, wherein the plurality of the nanostructures and the stack of semiconductor layers share the same composition.

12. The semiconductor structure of claim 10, wherein the plurality of the nanostructures and the stack of semiconductor layers comprise silicon or silicon germanium.

13. The semiconductor structure of claim 10, further comprising:
a silicide feature disposed on the source/drain feature; and
a source/drain contact over the silicide feature.

14. The semiconductor structure of claim 13, wherein, along the direction, the dielectric gate structure is spaced apart from the source/drain contact by a gate spacer.

15. The semiconductor structure of claim 14, further comprising:
a gate top dielectric layer disposed over the dielectric gate structure and the gate spacer,
wherein the gate top dielectric layer is in direct contact with the source/drain contact.

16. A semiconductor structure, comprising:
a base fin arising from a substrate and extending lengthwise along a first direction;
a plurality of nanostructures disposed over the base fin;
a metal gate structure wrapping around each of the plurality of nanostructures and extending lengthwise along a second direction perpendicular to the first direction;
a pair of gate end dielectric layers sandwiching the metal gate structure along the second direction;
a dielectric gate structure disposed over the base fin; and
a source/drain feature disposed between the metal gate structure and the dielectric gate structure along the first direction; and
a source/drain contact over the source/drain feature,
wherein, along the first direction, the dielectric gate structure is spaced apart from the source/drain contact by a gate spacer,
wherein, along the first direction, the dielectric gate structure is spaced apart from the source/drain feature by a stack of semiconductor layers interleaved by a stack of inner spacer features.

17. The semiconductor structure of claim 16, wherein a dielectric constant of the pair of gate end dielectric layers is greater than a dielectric constant of the gate spacer or a dielectric constant of the stack of inner spacer features.

18. The semiconductor structure of claim 16, wherein the dielectric gate structure partially extends into the base fin.

19. The semiconductor structure of claim 16, further comprising:
an isolation feature over the substrate,
wherein the base fin is disposed in the isolation feature,
wherein the dielectric gate structure partially extends into the isolation feature.

20. The semiconductor structure of claim 16, further comprising:
a silicide feature disposed between the source/drain feature and the source/drain contact,
wherein the silicide feature is spaced apart from the dielectric gate structure by the gate spacer along the first direction.

* * * * *